US010209627B2

(12) United States Patent
Lee et al.

(10) Patent No.: US 10,209,627 B2
(45) Date of Patent: Feb. 19, 2019

(54) SYSTEMS AND METHODS FOR FOCUS-SENSITIVE METROLOGY TARGETS

(71) Applicant: KLA-Tencor Corporation, Milpitas, CA (US)

(72) Inventors: Myungjun Lee, San Jose, CA (US); Stewart Robertson, Milpitas, CA (US); Mark D. Smith, San Jose, CA (US); Pradeep Subrahmanyan, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 26 days.

(21) Appl. No.: 15/413,628

(22) Filed: Jan. 24, 2017

(65) Prior Publication Data

US 2018/0196358 A1 Jul. 12, 2018

Related U.S. Application Data

(60) Provisional application No. 62/443,577, filed on Jan. 6, 2017.

(51) Int. Cl.
*G03B 27/52* (2006.01)
*G03F 7/20* (2006.01)
*G03F 1/44* (2012.01)

(52) U.S. Cl.
CPC ............ *G03F 7/70641* (2013.01); *G03F 1/44* (2013.01); *G03F 7/70091* (2013.01)

(58) Field of Classification Search
CPC ............. G03F 7/70091; G03F 7/70641; G03F 7/70191
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

| EP | 1400855 A2 | 3/2004 |
| JP | 2015002205 A | 1/2015 |

OTHER PUBLICATIONS

Myungjun Lee et al., Quantifying imaging performance bounds of extreme dipole illumination in high NA optical lithography, Proceedings of SPIE, Photomask Technology 2016, vol. 9985, Oct. 3, 2016, 16 pages.

(Continued)

*Primary Examiner* — Peter B Kim
(74) *Attorney, Agent, or Firm* — Suiter Swantz pc llo

(57) ABSTRACT

A lithography system includes an illumination source, projection optical elements, and a pattern mask. The illumination source includes one or more illumination poles. The pattern mask includes a set of focus-sensitive mask elements distributed with a pitch and, is configured to diffract illumination from the one or more illumination poles. The pitch may be selected such that two diffraction orders of illumination associated with each of the one or more illumination poles are asymmetrically distributed in a pupil plane of the projection optical elements. Further, the projection optical elements may expose a sample with an image of the set of focus-sensitive pattern mask elements based on the two diffraction orders of illumination associated with each of the one or more illumination poles such that one or more printing characteristics is indicative of a position of the sample within a focal volume of the projection optical elements.

35 Claims, 32 Drawing Sheets

(56) References Cited

U.S. PATENT DOCUMENTS

| | | | |
|---|---|---|---|
| 6,429,943 | B1 | 8/2002 | Opsal et al. |
| 6,673,638 | B1 | 1/2004 | Bendik et al. |
| 6,884,552 | B2 | 4/2005 | Mieher et al. |
| 6,985,618 | B2 | 1/2006 | Adel et al. |
| 7,352,453 | B2 | 4/2008 | Mieher et al. |
| 7,382,447 | B2 | 6/2008 | Mieher et al. |
| 7,478,019 | B2 | 1/2009 | Zangooie et al. |
| 7,545,520 | B2 | 6/2009 | Lee et al. |
| 7,564,557 | B2 | 7/2009 | Mieher et al. |
| 7,933,026 | B2 | 4/2011 | Opsal et al. |
| 9,291,554 | B2 | 3/2016 | Kuznetsov et al. |
| 2003/0160163 | A1 | 8/2003 | Wong et al. |
| 2007/0148558 | A1* | 6/2007 | Akbar .............. G03F 1/60 430/5 |
| 2009/0316125 | A1* | 12/2009 | Finders ........... G03F 7/70191 355/53 |
| 2011/0027704 | A1* | 2/2011 | Cramer ........... G03F 7/70641 430/30 |
| 2014/0172394 | A1 | 6/2014 | Kuznetsov et al. |
| 2015/0109624 | A1 | 4/2015 | Kreuzer et al. |
| 2015/0204664 | A1 | 7/2015 | Bringoltz et al. |
| 2016/0334716 | A1 | 11/2016 | Mieher |

OTHER PUBLICATIONS

International Search Report dated Apr. 27, 2018 for PCT/US2018/012249.

* cited by examiner

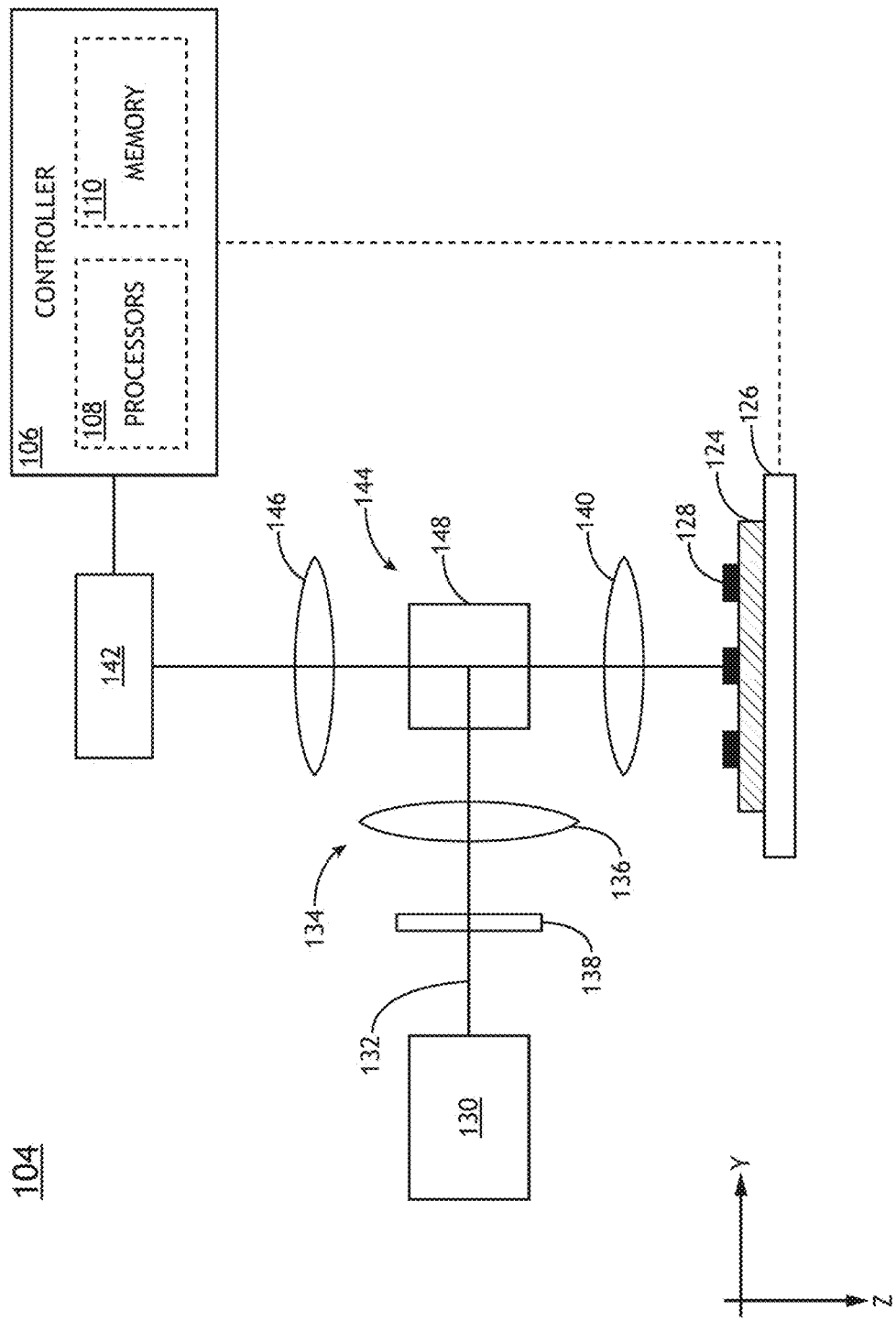

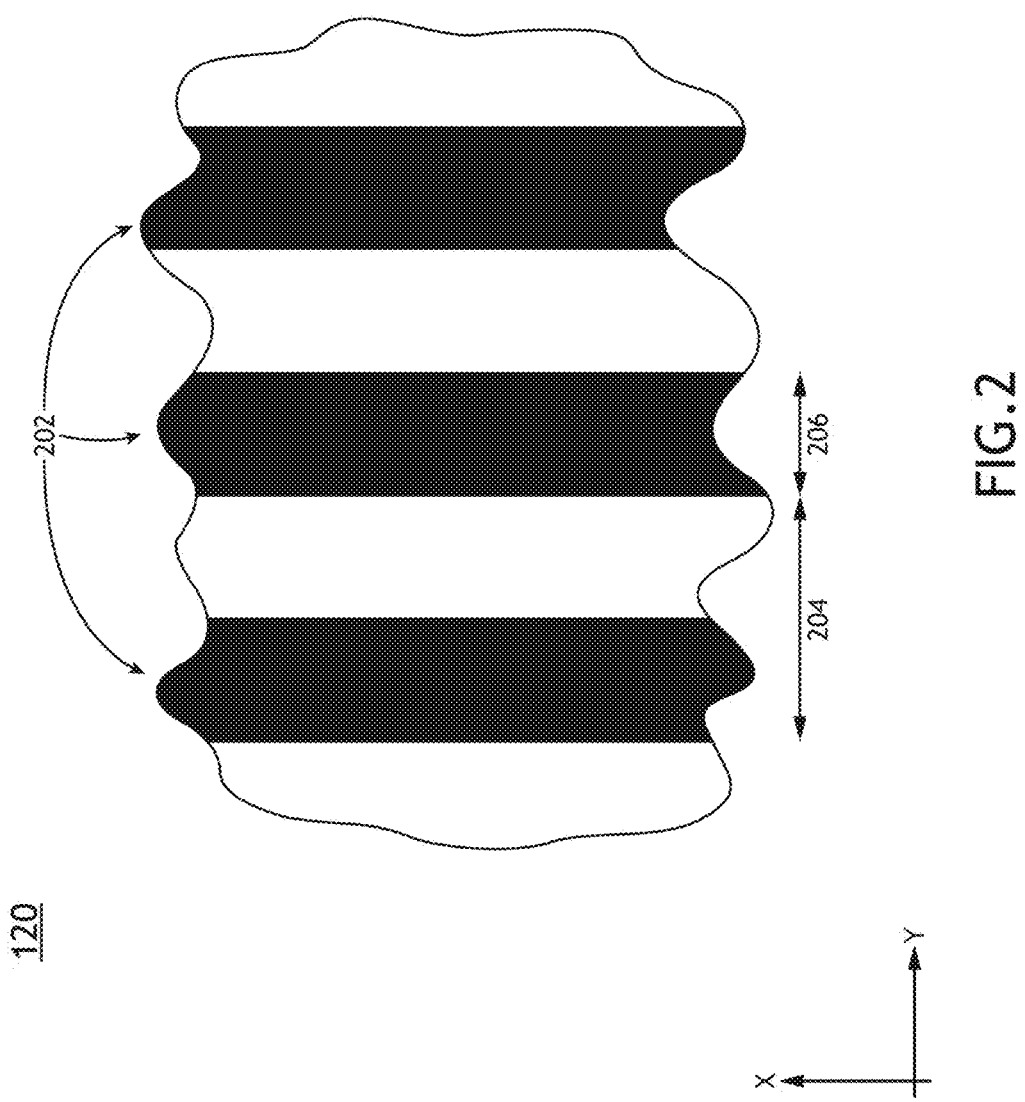

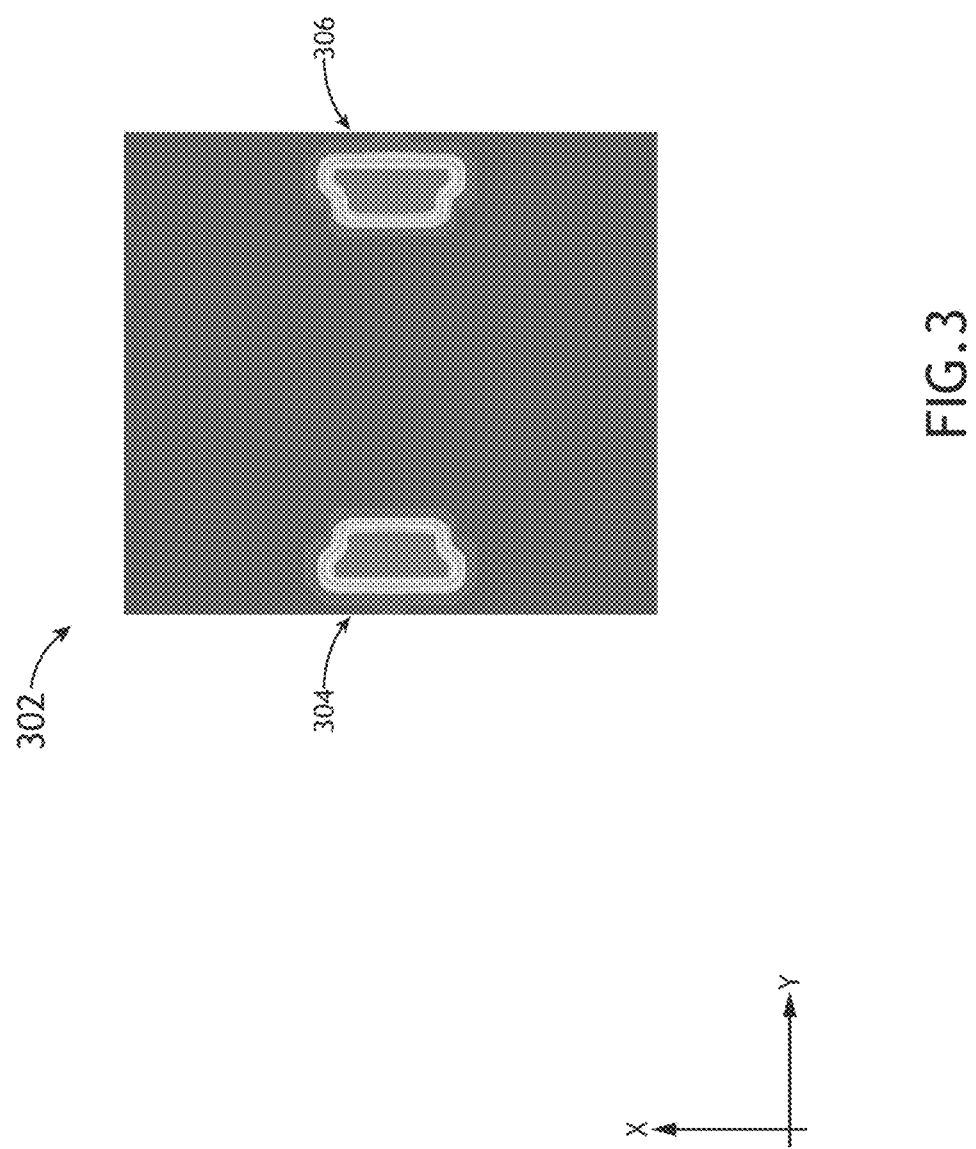

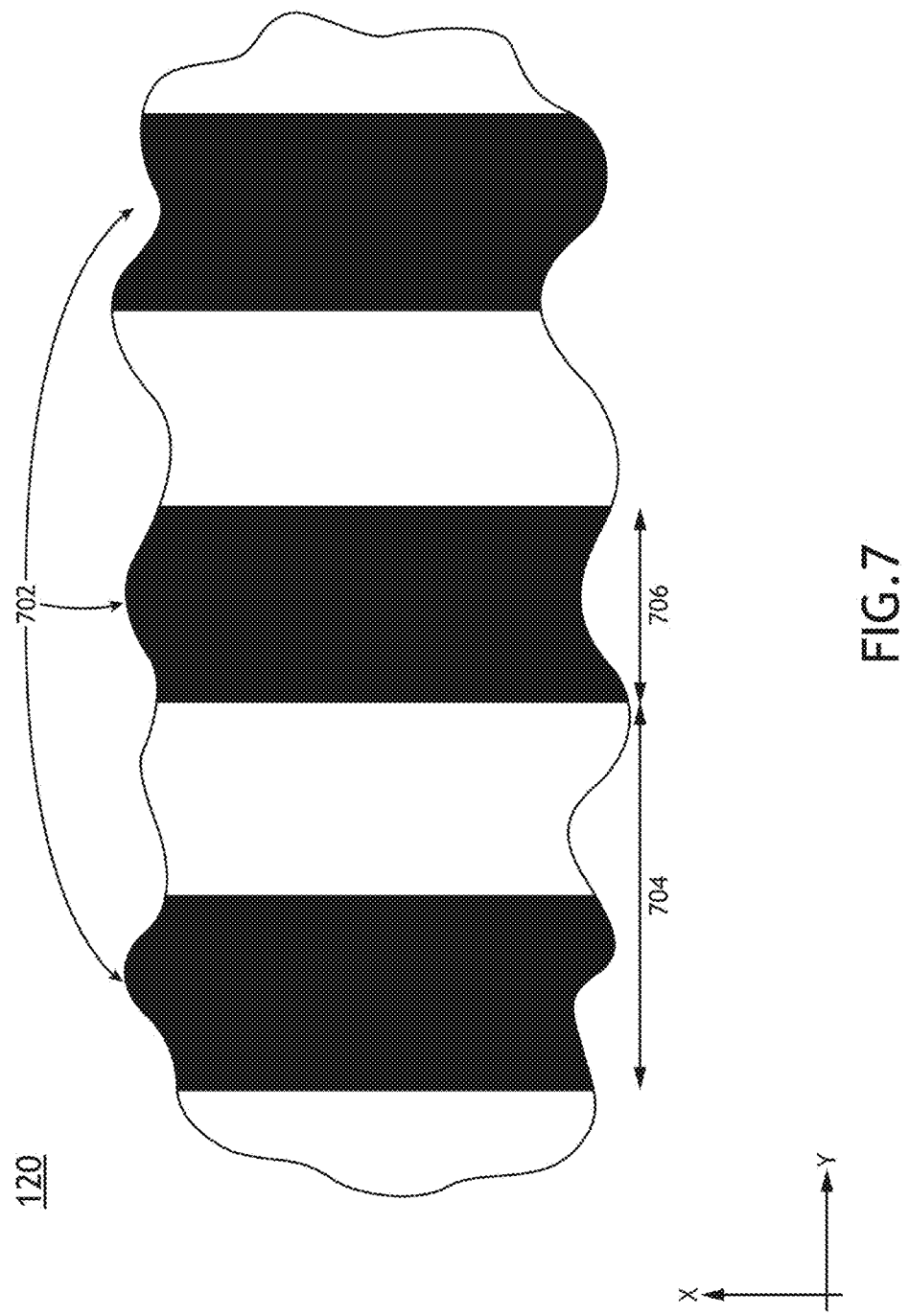

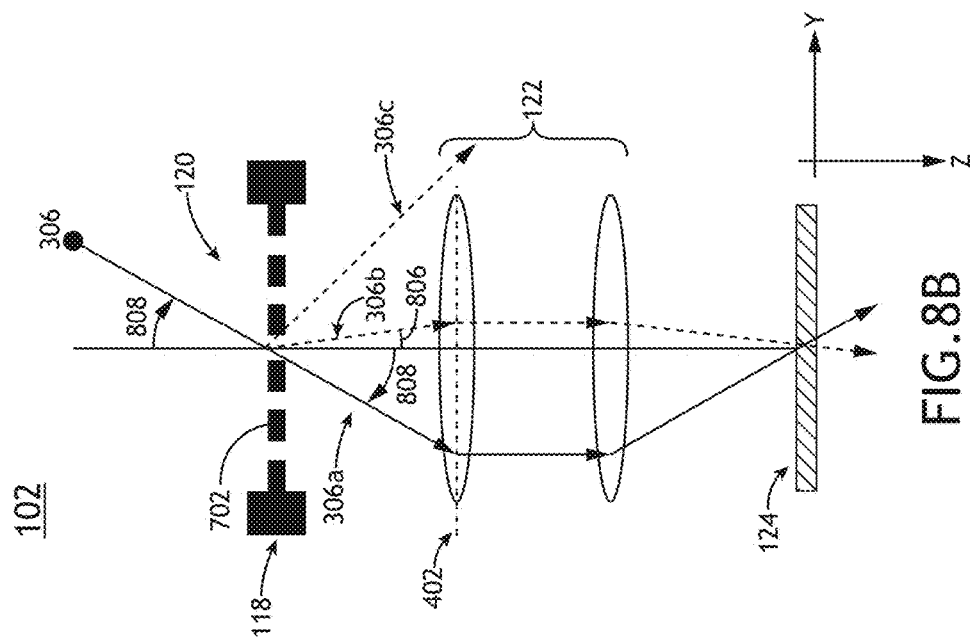
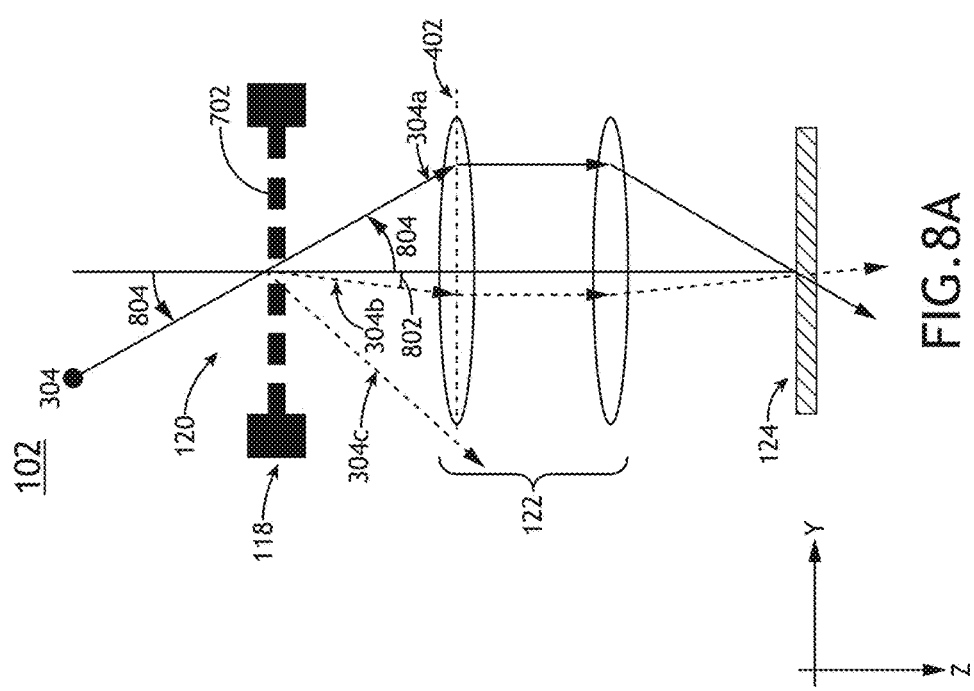

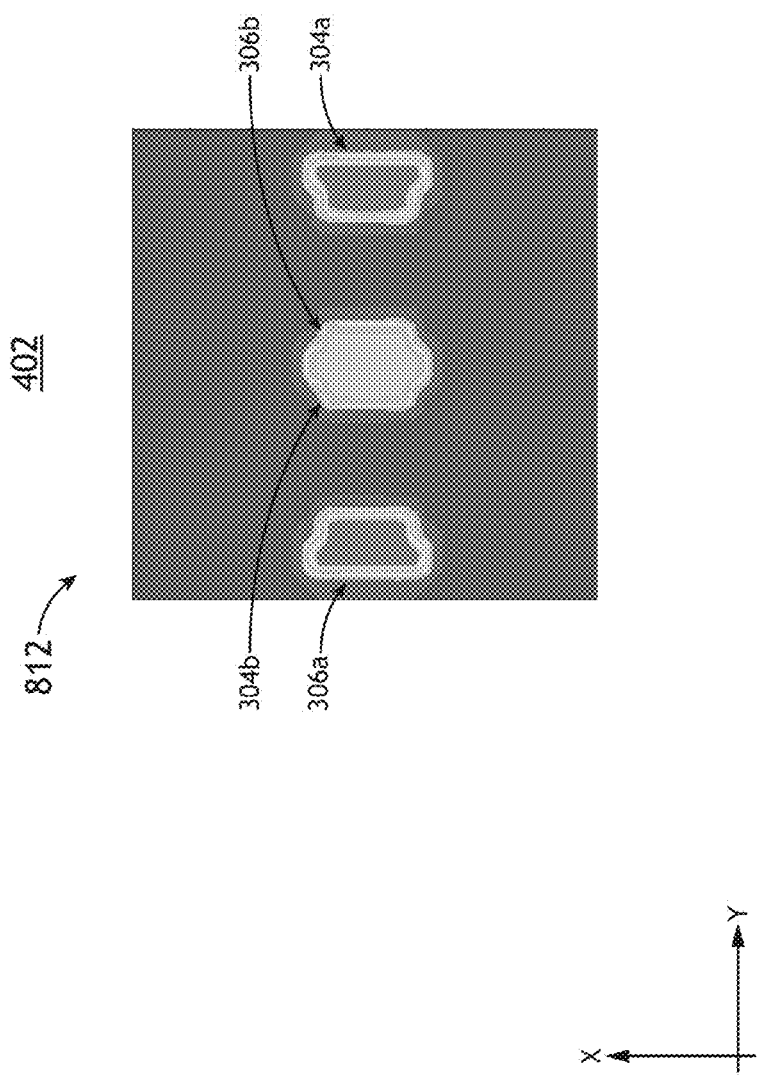

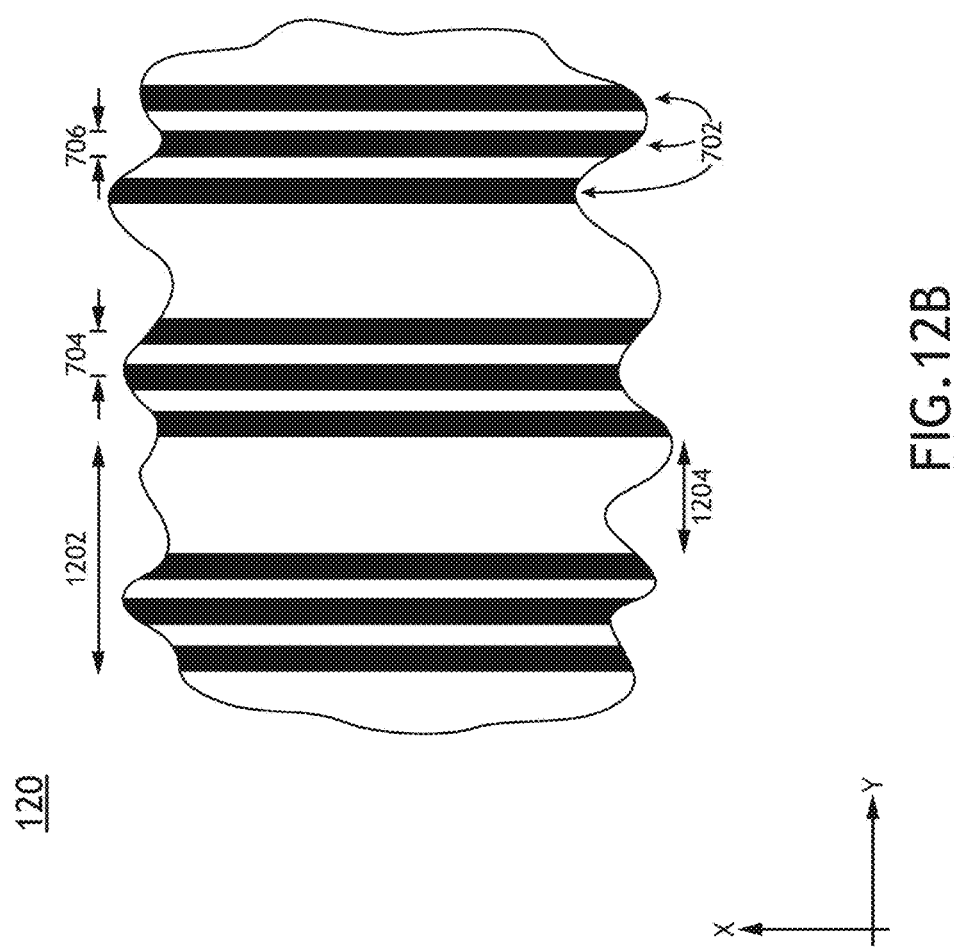

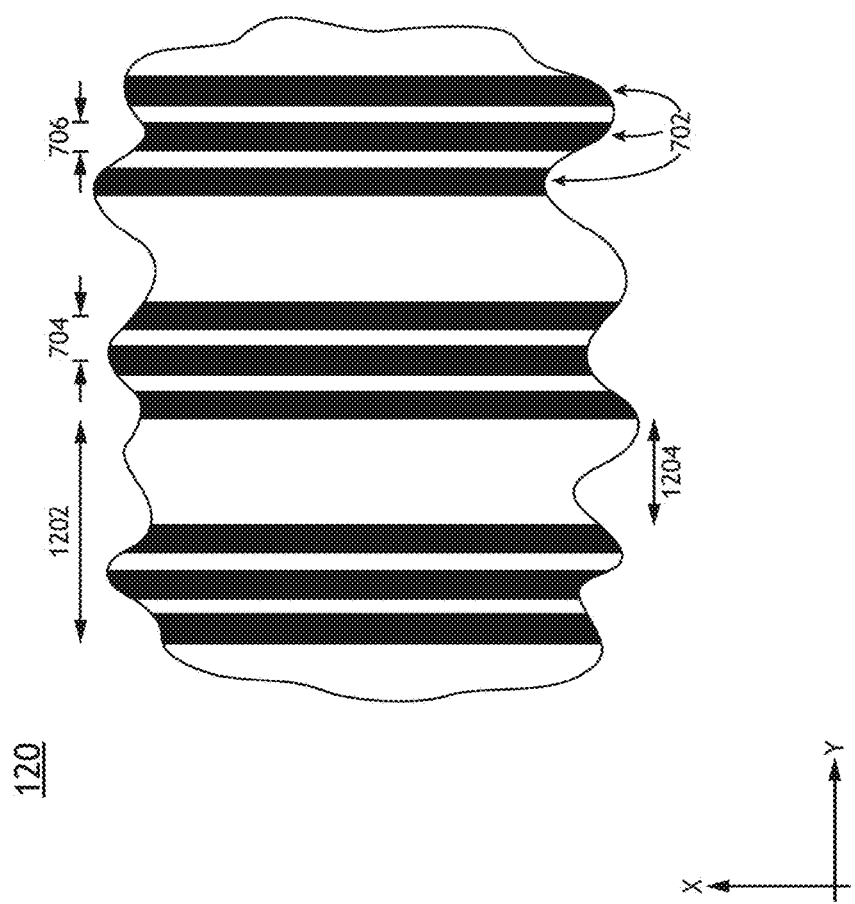

SYSTEMS AND METHODS FOR FOCUS-SENSITIVE METROLOGY TARGETS

CROSS-REFERENCE TO RELATED APPLICATION

The present application claims the benefit under 35 U.S.C. § 119(e) of U.S. Provisional Application Ser. No. 62/443,577, filed Jan. 1, 2017, entitled DESIGNING FOCUS SENSITIVE TARGET FOR TURBOSHAPE APPLICATION, naming Myungjun Lee, Stewart Robertson, Mark D. Smith, Pradeep Subrahmanyan, and Dimitry Sanko as inventors.

TECHNICAL FIELD

The present disclosure relates generally to metrology, and more particularly, to co-optimization of illumination sources and pattern masks for fabricating focus-sensitive metrology targets.

BACKGROUND

Semiconductor wafers must be accurately placed within the focal region of lithography tools within tight tolerances to properly write features having narrow linewidths and high densities. Focus-sensitive metrology targets are specialized features patterned onto the wafer during a lithography step in which one or more characteristics of the mark (e.g. alignment of two features, sidewall angle, a feature dimension, or the like) is indicative of the focal position of the wafer during the lithography step. Focus sensitive metrology targets are typically generated as images of pattern masks generated by the lithography tool. In this way, focus-sensitive pattern masks contain one or more pattern elements that, when imaged on the wafer, exhibit exposure characteristics that vary based on the focal position of the wafer.

Further, it is desirable that pattern masks used to generate focus-sensitive metrology targets to be used in a semiconductor fabrication line be cost-effective and integrate with the pattern masks used to write the semiconductor devices under production. Therefore, it would be desirable to provide a system and method for curing defects such as those identified above.

SUMMARY

A lithography system is disclosed, in accordance with one or more illustrative embodiments of the present disclosure. In one illustrative embodiment, the system includes an illumination source. In another illustrative embodiment, the illumination source includes one or more illumination poles. In another illustrative embodiment, the system includes one or more projection optical elements. In another illustrative embodiment, the system includes a pattern mask. In another illustrative embodiment, the pattern mask includes a set of focus-sensitive mask elements periodically distributed with a pitch. In another illustrative embodiment, the set of focus-sensitive mask elements is configured to diffract illumination from the one or more illumination poles. In another illustrative embodiment, the pitch is selected such that two diffraction orders of illumination associated with each of the one or more illumination poles are asymmetrically distributed in a pupil plane of the one or more projection optical elements. In another illustrative embodiment, the one or more projection optical elements are configured to expose a sample with an image of the set of focus-sensitive pattern mask elements based on the two diffraction orders of illumination associated with each of the one or more illumination poles. In another illustrative embodiment, one or more printing characteristics of the image of the set of focus-sensitive pattern mask elements on the sample is indicative of a position of the sample within a focal volume of the one or more projection optical elements.

A focus-sensitive pattern mask for a lithography system is disclosed, in accordance with one or more illustrative embodiments of the present disclosure. In one illustrative embodiment, the pattern mask includes a set of focus-sensitive mask elements periodically distributed with a pitch. In another illustrative embodiment, the set of focus-sensitive mask elements is configured to diffract illumination from the one or more illumination poles. In another illustrative embodiment, the pitch is configured such that such that two diffraction orders of illumination associated with each of the one or more illumination poles are asymmetrically distributed in a pupil plane of one or more projection optical elements. In another illustrative embodiment, the one or more projection optical elements are configured to expose a sample with an image of the set of focus-sensitive pattern mask elements based on the two diffraction orders of illumination associated with each of the one or more illumination poles. In another illustrative embodiment, one or more printing characteristics of the image of the set of focus-sensitive pattern mask elements on the sample is indicative of a position of the sample within a focal volume of the one or more projection optical elements.

A method for defining a focus-sensitive pattern mask is disclosed, in accordance with one or more illustrative embodiments of the present disclosure. In one illustrative embodiment, the method includes receiving an illumination profile of an illumination source, wherein the illumination profile includes one or more illumination poles. In another illustrative embodiment, the method includes selecting, with one or more processors, a pitch of a periodically distributed set of focus-sensitive mask elements. In another illustrative embodiment, the set of focus-sensitive mask elements is configured to diffract illumination from the one or more illumination poles. In another illustrative embodiment, the pitch is configured such that two diffraction orders of illumination associated with each of the one or more illumination poles are asymmetrically distributed in a pupil plane of one or more projection optical elements. In another illustrative embodiment, the one or more projection optical elements expose a sample with an image of the set of focus-sensitive pattern mask elements based on the two diffraction orders of illumination associated with each of the one or more illumination poles. In another illustrative embodiment, one or more printing characteristics of the image of the set of focus-sensitive pattern mask elements on the sample is indicative of a position of the sample within a focal volume of the one or more projection optical elements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1C is a conceptual view illustrating a metrology sub-system, in accordance with one or more embodiments of the present disclosure.

FIG. 2 is a top view of a pattern mask containing device mask elements for the fabrication of device features, in accordance with one or more embodiments of the present disclosure.

FIG. 3 is a plot illustrating an illumination profile of an illumination source designed to provide focus-insensitive exposure of device mask elements on a sample, in accordance with one or more embodiments of the present disclosure.

FIG. 7 is a top view of a pattern mask containing focus-sensitive mask elements for the fabrication of focus-sensitive printed elements based on a pre-defined illumination profile of an illumination source, in accordance with one or more embodiments of the present disclosure.

FIG. 8A is a conceptual view of a lithography sub-system illustrating the asymmetric collection of a 0-order diffraction beam and a $1^{st}$ order diffraction beam from focus-sensitive mask elements and the asymmetric illumination of a sample, in accordance with one or more embodiments of the present disclosure.

FIG. 8B is a conceptual view of lithography sub-system illustrating the asymmetric collection of a 0-order diffraction beam and a $1^{st}$ order diffraction beam from focus-sensitive mask elements and the asymmetric illumination of a sample, in accordance with one or more embodiments of the present disclosure.

FIG. 8D is a plot 812 illustrating a distribution of illumination in a pupil plane for focus-sensitive mask elements with a selected focus-sensitive pitch of 180 nm, in accordance with one or more embodiments of the present disclosure.

FIG. 12B is a top view of a portion of a pattern mask including groups of three focus-sensitive mask elements distributed with a coarse pitch of 800 nm, a coarse space of 400 nm, a focus-sensitive pitch of 160 nm, and a focus-sensitive width of 80 nm, in accordance with one or more embodiments of the present disclosure.

FIG. 12C is a top view of a portion of a pattern mask including groups of three focus-sensitive mask elements distributed with a coarse pitch of 800 nm, a coarse space of 380 nm, a focus-sensitive pitch of 160 nm, and a focus-sensitive width of 100 nm, in accordance with one or more embodiments of the present disclosure.

DETAILED DESCRIPTION

Figure 1A:
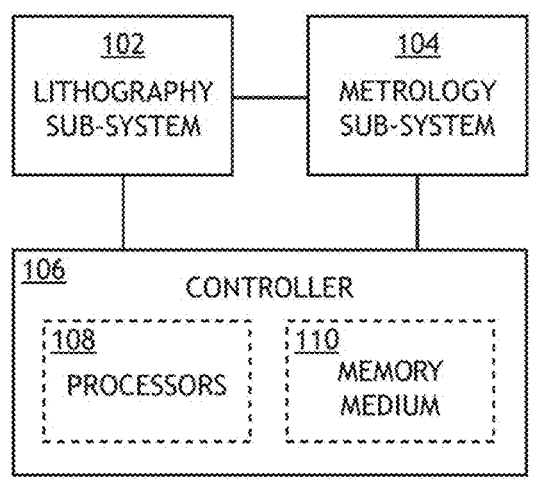
FIG. 1A is a conceptual view illustrating a semiconductor device system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for the generation of focus-sensitive pattern masks. For example, a focus-sensitive pattern mask may include one or more focus-sensitive mask elements such that lithographically-printed features on a sample corresponding to images of the focus-sensitive mask elements may have one or more characteristics indicative of a focal position of the sample within a lithography system.

A semiconductor device may be formed as multiple layers of printed elements. Printed features on a sample associated with a process layer may be fabricated through a series of additive or subtractive process steps such as, but not limited to, one or more material deposition steps, one or more lithography steps, one or more etching steps, or one or more lift-off steps. For example, a lithography-etch (LE) process for printing features may include, but is not limited to, depositing a layer of a photosensitive material onto a sample (e.g. a resist layer), exposing the sample with an image of a pattern mask to modify the resistivity of the photosensitive material to an etchant, and etching away either the exposed or unexposed portions of the photosensitive layer to leave behind printed features corresponding to the image of the pattern mask. Further, the photosensitive material may serve as a hard mask such that an etching step may include etching past the photosensitive material into one or more layers of the sample below the photosensitive material. The photosensitive material may optionally be removed by subsequent process steps.

Each process layer must be fabricated within specific tolerances to properly construct the final device. For example, characteristics of printed elements (e.g. fabrication metrics) such as, but not limited to, feature sizes, sidewall angles, or the relative placement of printed elements in each layer must be well characterized and controlled. A process window typically defines ranges of process parameters suitable for fabrication of the printed elements within the specified tolerance for a given configuration of the lithography system. For example, a process window may define limits on the defocus associated with the position of the sample along the optical axis of the lithography tool (e.g. the focal position of the sample). By way of another example, a process window may define limits on the dose of energy from the illumination source incident on the sample (e.g. the exposure of the sample).

A lithography system may operate by illuminating a pattern mask, which then diffracts and/or scatters the illumination according to the mask elements on the pattern mask. Optical elements within the lithography system (e.g. an objective lens along with one or more additional optical elements) may then generate an image of the pattern mask on the sample based on the diffracted and/or scattered illumination from the pattern mask collected by the objective lens (e.g. an aerial image). In this regard, while the optical resolution of a lithography system may be largely determined by the physical layout and the numerical aperture of the optical elements such as the objective lens, certain aspects of the pattern mask and/or the lithography system may impact the collected diffracted and/or scattered illumination and thus the process window for generating the image of the pattern mask on the sample within specified tolerances.

It is typically desirable to design a lithography process to have a large process window when fabricating device elements to maximize the amount of tolerable variations of process parameters. Therefore, it may be advantageous to tailor the illumination profile of the lithography system to maximize the process window for device elements associated with a lithography process.

However, even if the illumination profile of a lithography system is tailored to provide a large process window for a device of interest, it is typically desirable to monitor and/or control several relevant process parameters. Accordingly, metrology targets may be fabricated on one or more process layers such that deviations of fabrication metrics of metrology targets on a process layer may represent deviations of fabrication metrics of all printed elements on the layer. Further, deviations of fabrication metrics associated with a metrology target may be provided to control process tools. For example, data associated with deviations of fabrication metrics may serve as corrective feedback to control process tools responsible for the deviations. By way of another example, deviations of fabrication metrics may serve as feed-forward data to additional process tools to compensate for the measured deviations in subsequent process steps.

It is recognized herein that the bounds of a process window for a given configuration of the lithography system may typically be generated by a multi-dimensional analysis of process parameters (e.g. a focus-exposure matrix (FEM), or the like) to assess the relative impact of variations of the process parameters on printed features. Accordingly, a large design of experiments (DOE) may typically be required to develop a process-sensitive metrology target (e.g. a focus-sensitive metrology target, or the like). Embodiments of the present disclosure are directed to designing focus-sensitive pattern masks for focus-sensitive metrology targets based on one or more characteristics of an illumination profile (e.g. an illumination profile optimized for a large process window for printed device elements). In this regard, the DOE of designing focus-sensitive pattern masks may be substantially reduced, which may increase the efficiency and/or the efficacy of the design process. Further, focus-sensitive mask elements for focus-sensitive metrology targets designed according to various embodiments of the present disclosure may provide high sensitivity to the focal position of the sample.

Additional embodiments of the present disclosure are directed to selecting a pitch of pattern mask elements (e.g. periodically-distributed pattern mask elements) such that the pattern mask elements diffract incident illumination from one or more illumination poles of an illumination source, and such that two diffraction orders associated with each illumination pole are collected by projection optics (e.g. of a lithography system) to have an asymmetric distribution in a pupil plane of the projection optics. In this regard, the collected diffraction orders associated with each illumination pole may propagate through the projection optics with different optical path lengths. Accordingly, one or more printed characteristics of printed elements fabricated based on an image of the pattern mask elements formed from the two diffraction orders associated with each illumination pole may be sensitive to the focal position of the sample with respect to the projection optics.

Further embodiments of the present disclosure are directed to selecting a width of pattern mask elements along the direction of the pitch to equalize the relative intensities of collected diffraction orders associated with each illumination pole of an illumination source within a specified tolerance. In this regard, the impact of an asymmetric distribution of illumination in the pupil plane may be strong and the associated printed elements may be highly sensitive to the focal position of the sample with respect to the projection optics.

Process-sensitive lithographic features are generally described in U.S. Pat. No. 6,673,638, issued on Jan. 6, 2004, which is incorporated by reference in the entirety. Focus masking structures are generally described in U.S. Pat. No. 6,884,552, issued on Apr. 26, 2005, which is incorporated by reference in the entirety. Determining lithographic focus and exposure is generally described in U.S. Pat. No. 7,382,447, issued on Jun. 3, 2008, which is incorporated by reference in the entirety. Process optimization and control using scatterometry signals is generally described in U.S. Pat. No. 7,352,453, issued on Apr. 1, 2008, which is incorporated by reference in the entirety. Detecting overlay errors using scatterometry is generally described in U.S. Pat. No. 7,564,557, issued on Jul. 21, 2009, which is incorporated by reference in the entirety.

As used throughout the present disclosure, the term "sample" generally refers to a substrate formed of a semiconductor or non-semiconductor material (e.g. a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a conceptual view illustrating a semiconductor device system 100, in accordance with one or more embodiments of the present disclosure. In one embodiment, the system 100 includes including a lithography sub-system 102 for lithographically printing one or more patterns (e.g. metrology target patterns, or the like) on a sample. The lithography sub-system 102 may include any lithographic printing tool known in the art. For example, the lithography sub-system 102 may include, but is not limited to, a scanner or stepper. In another embodiment, the system 100 includes a metrology sub-system 104 to characterize one or more printed patterns on the sample. For example, the metrology sub-system 104 may measure any metrology metric (e.g. overlay error, pattern placement error, dimensions of sample features, critical dimensions (CD), sidewall angle, or the like) using any method known in the art. In one embodiment, the metrology sub-system 104 includes an image-based metrology tool to measure metrology data based on the generation of one or more images of a sample. In another embodiment, the metrology sub-system 104 includes a scatterometry-based metrology system to measure metrology data based on the scattering (reflection, diffraction, diffuse scattering, or the like) of light from the sample.

The lithography sub-system 102 of the present invention may implement any of the pattern mask designs described throughout the present disclosure. Lee et al. generally describe mask-based lithography in U.S. Pat. No. 7,545,520, issued on Jun. 9, 2009, which is incorporated herein in the entirety.

The metrology sub-system 104 may provide various types of measurements related to semiconductor manufacturing. For example, the metrology sub-system 104 may provide one or more metrology metrics of one or more metrology targets such as, but not limited to, critical dimensions, overlay of two or more process layers, sidewall angles, film thicknesses, or process-related parameters (e.g., focal position of a sample during a lithography step, an exposure dose of illumination during a lithography step, or the like).

In another embodiment, the system 100 includes a controller 106. In another embodiment, the controller 106 includes one or more processors 108 configured to execute program instructions maintained on a memory medium 110. In this regard, the one or more processors 108 of controller 106 may execute any of the various process steps described throughout the present disclosure.

Figure 1B:
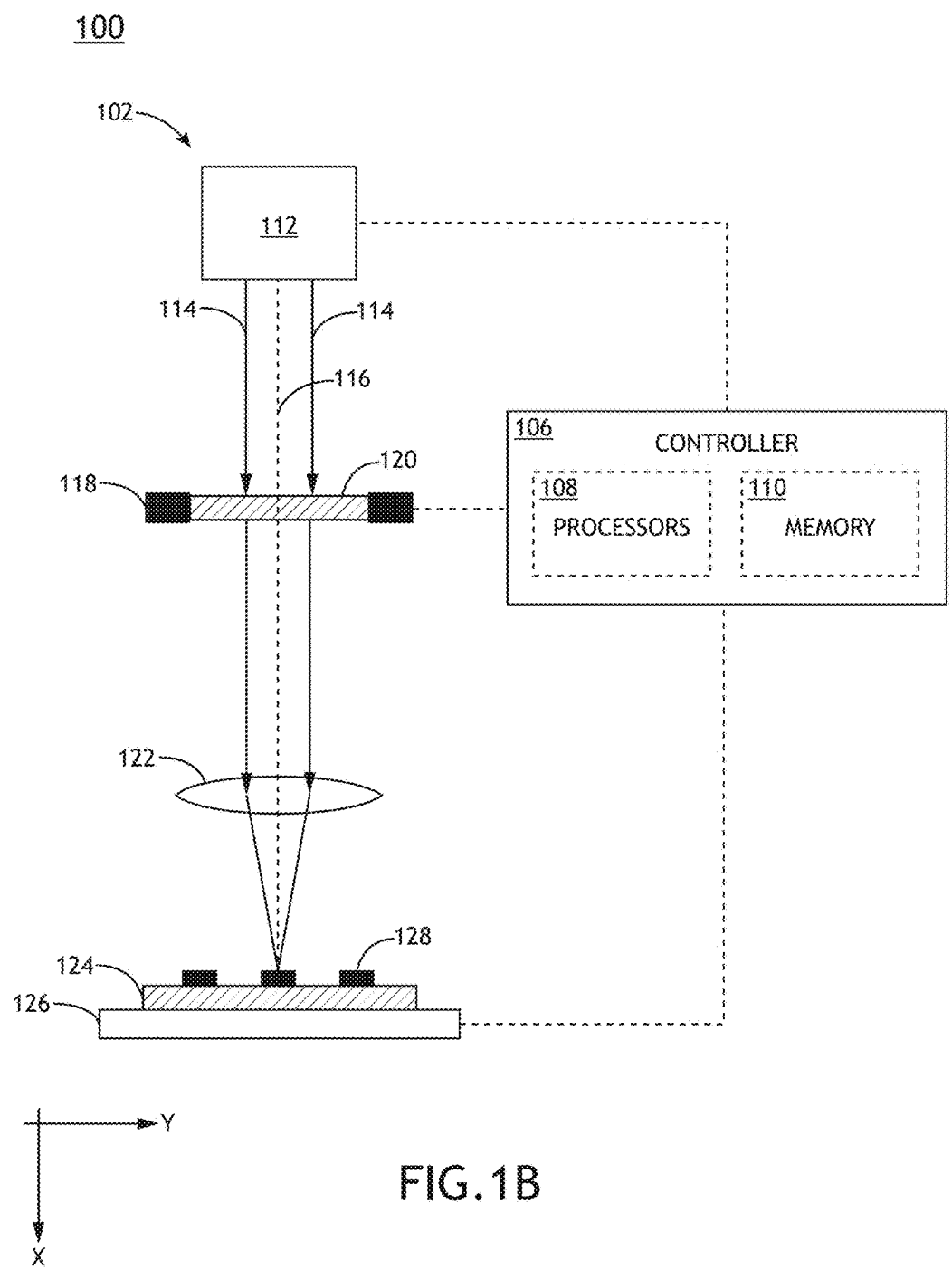
FIG. 1B is a conceptual view illustrating a lithography sub-system, in accordance with one or more embodiments of the present disclosure.

FIG. 1B is a conceptual view illustrating the lithography sub-system 102, in accordance with one or more embodiments of the present disclosure. In one embodiment, the lithography sub-system 102 includes a lithography illumination source 112 configured to generate one or more illumination beams 114. The one or more illumination beams 114 may include one or more selected wavelengths of light including, but not limited to, ultraviolet (UV) radiation, visible radiation, or infrared (IR) radiation.

Illumination from the lithography illumination source 112 may have any spatial distribution (e.g., illumination pattern). For example, the lithography illumination source 112 may include, but is not limited to, a single-pole illumination source, a dipole illumination source, a C-Quad illumination source, a Quasar illumination source, or a free-form illumination source. In this regard, the lithography illumination source 112 may generate an on-axis illumination beams 114 in which illumination propagates along (or parallel to) an optical axis 116 and/or any number of off-axis illumination beams 114 in which illumination propagates at an angle to the optical axis 116.

It is further noted herein that, for the purposes of the present disclosure, an illumination pole of the illumination source (e.g. lithography illumination source 112 of lithography sub-system 102) may represent illumination from a specific location of the illumination source. In this regard, each spatial location on an illumination source (e.g. with respect to the optical axis 116) may be considered an illumination pole. Further, an illumination pole may have any shape or size known in the art. Additionally, an illumination source may be considered to have an illumination profile corresponding to a distribution of illumination poles.

Further, the lithography illumination source 112 may generate the illumination beams 114 by any method known in the art. For an example, an illumination beam 114 may be formed as illumination from an illumination pole of the lithography illumination source 112 (e.g. a portion of an illumination profile of a lithography illumination source 112, or the like). By way of another example, lithography illumination source 112 may include multiple illumination sources for the generation of illumination beams 114.

In another embodiment, the lithography sub-system 102 includes a mask support device 118. The mask support device 118 is configured to secure a pattern mask 120. In another embodiment, the lithography sub-system 102 includes a set of projection optics 122 configured to project an image of the pattern mask 120 illuminated by the one or more illumination beams 114 onto a sample 124 disposed on a sample stage 126 in order to generate printed pattern elements corresponding to the image of the pattern mask 120. In another embodiment, the mask support device 118 may be configured to actuate or position the pattern mask 120. For example, the mask support device 118 may actuate the pattern mask 120 to a selected position with respect to the projection optics 122 of the system 100.

The sample 124 may include any number of photosensitive materials and/or material layers suitable for receiving the image of the pattern mask 120. For example, the sample 124 may include a resist layer 128. In this regard, the set of projection optics 122 may project an image of the pattern mask 120 onto on the resist layer 128 to expose the resist layer 128 and a subsequent etching step may remove the exposed material (e.g. positive etching) or the unexposed material (e.g. negative etching) in order to provide printed features on the sample 124. Further, the pattern mask 120 may be utilized in any imaging configuration known in the art. For example, the pattern mask 120 may be a positive mask (e.g. a bright-field mask) in which pattern elements are positively imaged as printed pattern elements. By way of another example, the pattern mask 120 may be a negative mask (e.g. a dark-field mask) in which pattern elements of the pattern mask 120 form negative printed pattern elements (e.g. gaps, spaces, or the like).

The controller 106 may be communicatively coupled to the mask support device 118 and/or the sample stage 126 to direct the transfer of pattern elements on a pattern mask 120 to a sample 124 (e.g. a resist layer 128 on the sample, or the like).

FIG. 1C is a conceptual view illustrating the metrology sub-system 104, in accordance with one or more embodiments of the present disclosure. In one embodiment, the metrology sub-system 104 includes a metrology illumination source 130 to generate a metrology illumination beam 132. In another embodiment, the metrology illumination source 130 is the same as the lithography illumination source 112. In a further embodiment, the metrology illumination source 130 is a separate illumination source configured to generate a separate metrology illumination beam 132. The metrology illumination beam 132 may include one or more selected wavelengths of light including, but not limited to, ultraviolet (UV) radiation, visible radiation, or infrared (IR) radiation.

In another embodiment, the metrology illumination source 130 directs the metrology illumination beam 132 to the sample 124 via an illumination pathway 134. The illumination pathway 134 may include one or more lenses 136 or additional optical components 138 suitable for modifying and/or conditioning the metrology illumination beam 132. For example, the one or more optical components 138 may include, but are not limited to, one or more polarizers, one or more filters, one or more beam splitters, one or more diffusers, one or more homogenizers, one or more apodizers, or one or more beam shapers. In another embodiment, the metrology sub-system 104 includes an objective lens 140 to focus the metrology illumination beam 132 onto the sample 124.

In another embodiment, the metrology sub-system 104 includes a detector 142 configured to capture radiation emanating from the sample 124 through a collection pathway 144. For example, a detector 142 may receive an image of the sample 124 provided by elements in the collection pathway 144 (e.g., the objective lens 140, lenses 146, or the like). By way of another example, a detector 142 may receive radiation reflected or scattered (e.g., via specular reflection, diffuse reflection, and the like) from the sample 124. By way of another example, a detector 142 may receive radiation generated by the sample 124 (e.g., luminescence associated with absorption of the metrology illumination beam 132, or the like). By way of another example, a detector 142 may receive one or more diffracted orders of radiation from the sample 124 (e.g., 0-order diffraction, ±1 order diffraction, ±2 order diffraction, and the like).

The detector 142 may include any type of optical detector known in the art suitable for measuring illumination received from the sample 124. For example, a detector 142 may include, but is not limited to, a CCD detector, a TDI detector, a photomultiplier tube (PMT), an avalanche photodiode (APD), or the like. In another embodiment, a detector 142 may include a spectroscopic detector suitable for identifying wavelengths of radiation emanating from the sample 124.

The collection pathway 144 may further include any number of optical elements to direct and/or modify illumination collected by the objective lens 140 including, but not limited to, one or more lenses 146, one or more filters, one or more polarizers, or one or more beam blocks.

In one embodiment, as illustrated in FIG. 1C, the metrology sub-system 104 may include a beamsplitter 148 oriented such that the objective lens 140 may simultaneously direct the metrology illumination beam 132 to the sample 124 and collect radiation emanating from the sample 124. In this regard, the metrology sub-system 104 may be configured in an epi-mode.

Figure 1D:
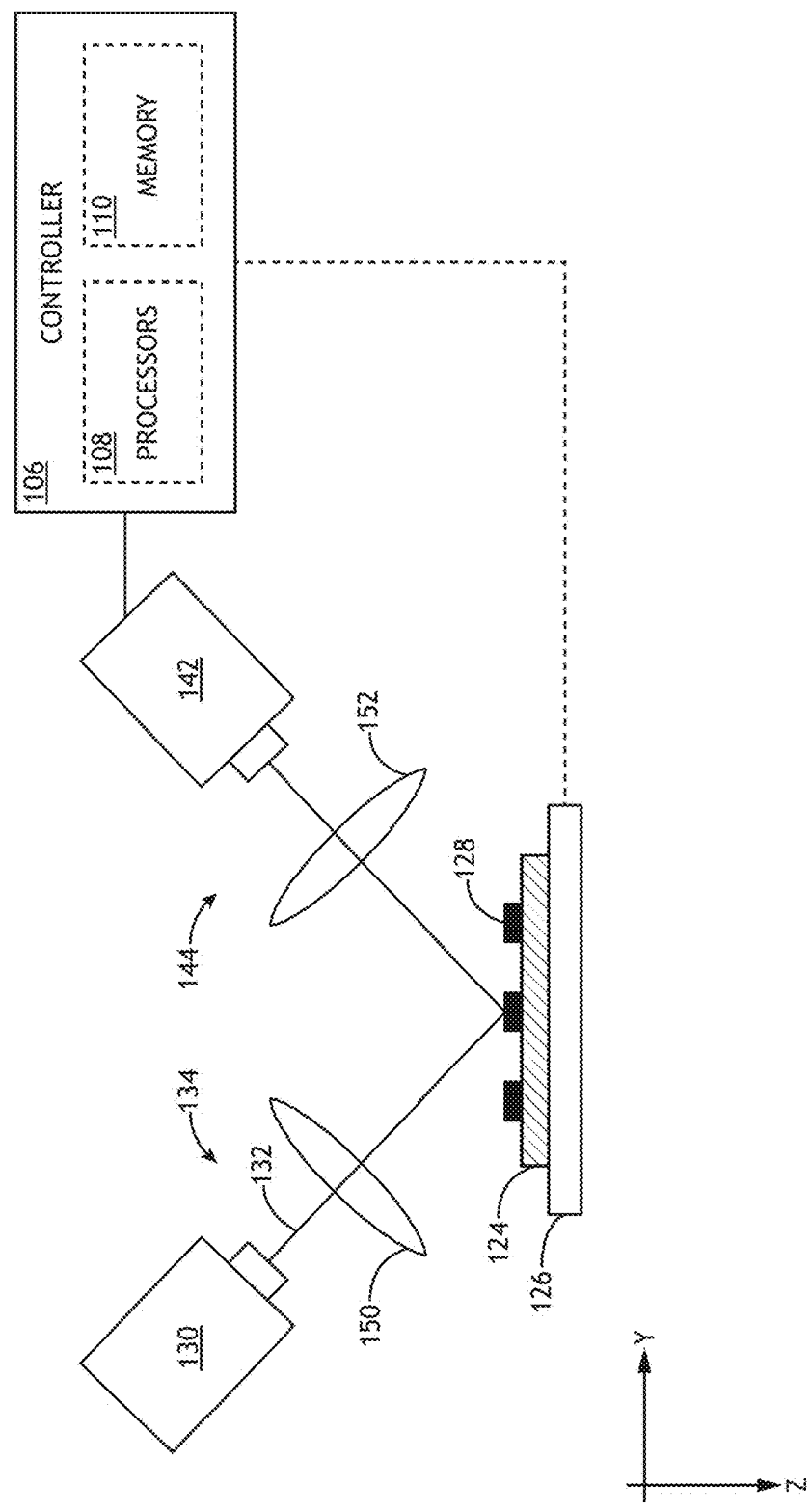
FIG. 1D is a conceptual view illustrating a metrology sub-system in which an illumination pathway and a collection pathway include separate elements, in accordance with one or more embodiments of the present disclosure.

FIG. 1D is a conceptual view illustrating a metrology sub-system 104 in which an illumination pathway 134 and a collection pathway 144 include separate elements, in accordance with one or more embodiments of the present disclosure. For example, the illumination pathway 134 may utilize a first focusing element 150 to focus the metrology illumination beam 132 onto the sample 124 and the collection pathway 144 may utilize a second focusing element 152 to collect radiation from the sample 124. In this regard, the numerical apertures of the first focusing element 150 and the second focusing element 152 may be different. Further, it is noted herein that the metrology sub-system 104 depicted in FIG. 1D may facilitate multi-angle illumination of the sample 124, and/or more than one metrology illumination source 130 (e.g. coupled to one or more additional detectors 142). In this regard, the metrology sub-system 104 depicted in FIG. 1D may perform multiple metrology measurements. In another embodiment, one or more optical components may be mounted to a rotatable arm (not shown) pivoting around the sample 124 such that the angle of incidence of the metrology illumination beam 132 on the sample 124 may be controlled by the position of the rotatable arm.

In another embodiment, the metrology sub-system 104 may include multiple detectors 142 (e.g. associated with multiple beam paths generated by one or more beamsplitters to facilitate multiple metrology measurements (e.g. multiple metrology tools) by the metrology sub-system 104.

In another embodiment, the metrology sub-system 104 is communicatively coupled to the controller 106 of system 100. In this regard, the controller 106 may be configured to receive data including, but not limited to, metrology data (e.g. metrology measurement results, images of the target, pupil images, and the like) or metrology metrics (e.g. precision, tool-induced shift, sensitivity, diffraction efficiency, through-focus slope, side wall angle, critical dimensions, and the like).

It is recognized herein that an illumination profile of an illumination source (e.g. lithography illumination source 112) may be tailored to provide a large process window for the robust fabrication of the device elements on a sample. For example, the illumination profile may be selected such that the lithography sub-system 102 may generate an image of device mask elements of pattern mask 120 with a large depth of field such that the associated printed device elements may be relatively insensitive to deviations of the focal position of the sample 124.

FIG. 2 is a top view of a pattern mask containing device mask elements for the fabrication of device features, in accordance with one or more embodiments of the present disclosure. In one embodiment, the pattern mask 120 includes a set of device mask elements 202 periodically distributed with a device pitch 204. In another embodiment, each of the device mask elements 202 has a device width 206. For example, the device pitch 204 and the device width 206 may be, but are not required to be, 90 nm and 45 nm, respectively. It is noted herein that the design of the device mask elements 202 on the pattern mask 120 is provided solely for illustrative purposes and should not be interpreted as limiting. The device mask elements 202 on a pattern mask 120 may have any size, shape, distribution, or orientation suitable for fabricated features associated with a semiconductor device. Further, the fabrication of printed device elements on a sample may be accomplished through multiple lithography and/or etching steps.

FIG. 3 is a plot illustrating an illumination profile 302 of an illumination source designed to provide focus-insensitive exposure of device mask elements 202 on the sample 124, in accordance with one or more embodiments of the present disclosure. In one embodiment, the illumination profile 302 includes a first illumination pole 304 and a second illumination pole 306. For example, each of the first illumination pole 304 and the second illumination pole 306 may generate an illumination beam 114 for illuminating at least a portion of the pattern mask 120.

In another embodiment, the first illumination pole 304 and the second illumination pole 306 are off-axis illumination poles. In this regard, the first illumination pole 304 and the second illumination pole 306 are separated from the optical axis 116 to provide off-axis illumination of the pattern mask 120. For example, the first illumination pole 304 and the second illumination pole 306 may be distributed about the optical axis 116 along the same direction as the device pitch 204 (e.g. the Y-direction in FIGS. 2 and 3). In another embodiment, as illustrated in FIG. 3, the first illumination pole 304 and the second illumination pole 306 are symmetrically distributed about the optical axis 116 to provide symmetric off-axis illumination of the pattern mask 120.

Figure 4B:
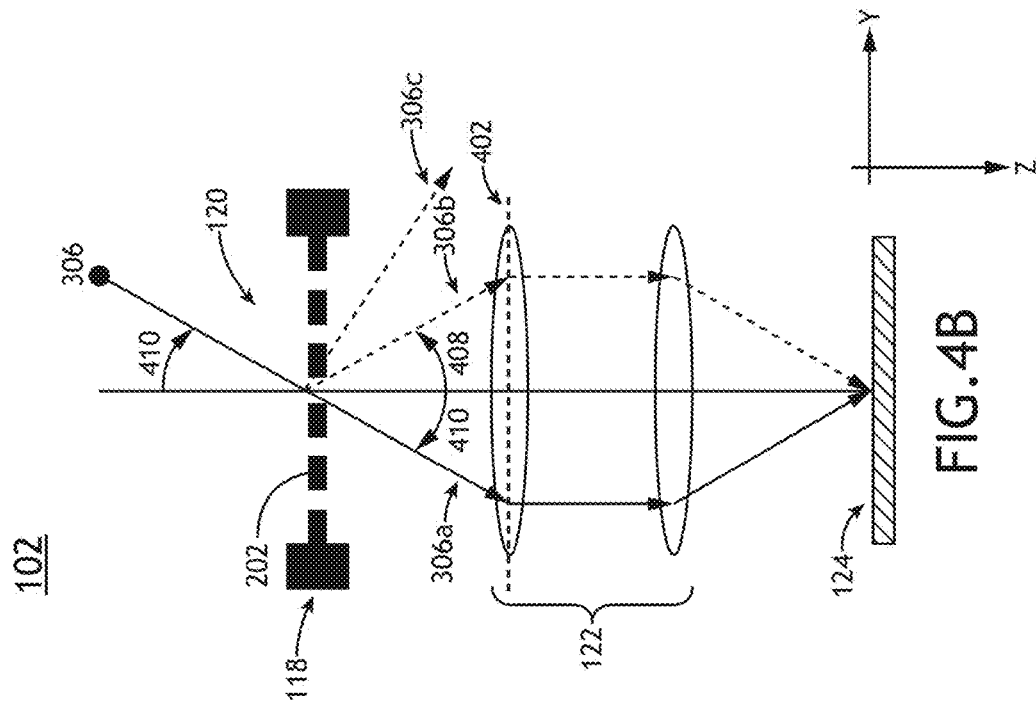
FIG. 4B is a conceptual view of a lithography sub-system illustrating the symmetric collection of a 0-order diffraction beam and a $1^{st}$ order diffraction beam from the device mask elements and the symmetric illumination of a sample, in accordance with one or more embodiments of the present disclosure.
Figure 4A:
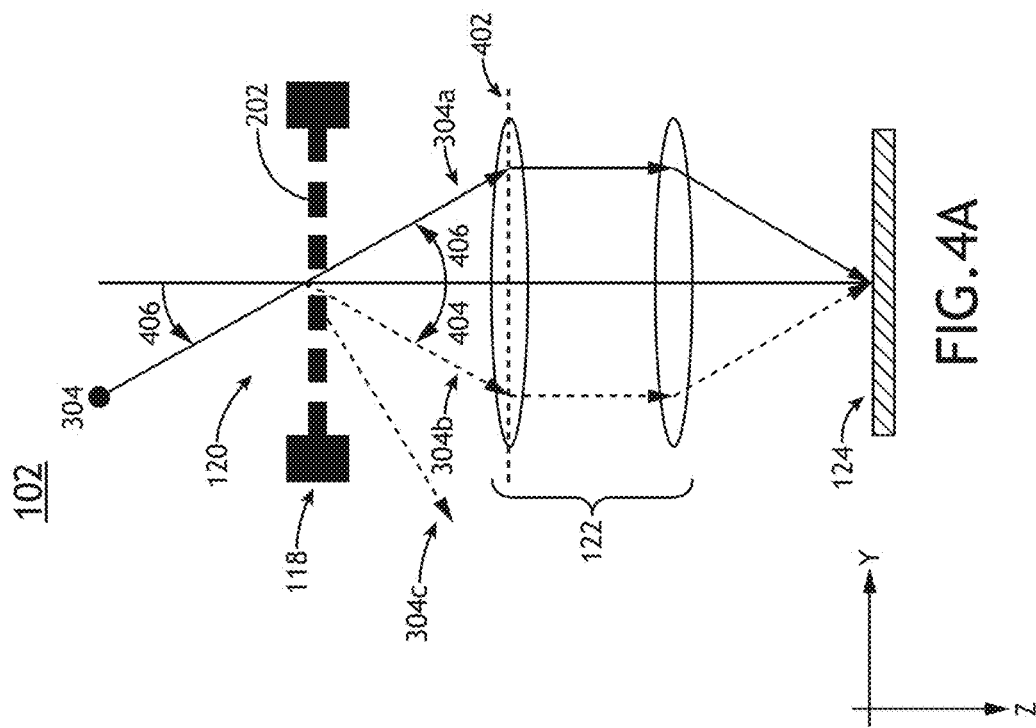
FIG. 4A is a conceptual view of a lithography sub-system illustrating the symmetric collection of a 0-order diffraction beam and a $1^{st}$ order diffraction beam from device mask elements and the symmetric illumination of a sample, in accordance with one or more embodiments of the present disclosure.

FIGS. 4A and 4B are conceptual views of a lithography system for exposing a sample with an image of the device mask elements 202 generated by collected orders of illumination diffracted by the device mask elements 202 (e.g. an aerial image), in accordance with one or more embodiments of the present disclosure. In one embodiment, the device mask elements 202 diffract illumination from the first illumination pole 304 to generate multiple diffraction beams including, but not limited to, a 0-order diffraction beam 304a, a $1^{st}$ order diffraction beam 304b, and a $2^{nd}$ order diffraction beam 304c. In another embodiment, the device mask elements 202 diffract illumination from the second illumination pole 306 to generate multiple diffraction beams including, but not limited to, a 0-order diffraction beam 306a, a $1^{st}$ order diffraction beam 306b, and a $2^{nd}$ order diffraction beam 306c.

In another embodiment, the lithography sub-system 102 is configured to expose the sample 124 with an image of the device mask elements 202 using symmetric illumination. It is noted herein that exposing the sample 124 with symmetric illumination may provide for the fabrication of printed elements that are relatively insensitive to deviations of the focal position of the sample. Accordingly, printed elements associated with the device mask elements 202 may have one or more characteristics (e.g. a position of the top of the corresponding printed element, a critical dimension associated with the separation of printed elements, one or more sidewall angles, or the like) that vary as a function of the focal position of the sample 124 along the optical axis 116.

For example, the lithography sub-system 102 may be configured such that diffracted orders of illumination from the device mask elements 202 are symmetrically distributed in a pupil plane (e.g. pupil plane 402) in which the spatial distribution of illumination corresponds to the angle at which the illumination emanates from the pattern mask 120.

FIG. 4A is a conceptual view of lithography sub-system 102 illustrating the symmetric collection of the 0-order diffraction beam 304a and the 1$^{st}$ order diffraction beam 304b from the device mask elements 202 and the symmetric illumination of the sample 124, in accordance with one or more embodiments of the present disclosure. For example, the illumination profile of the lithography illumination source 112 may be designed such that the diffraction angle 404 of the 1$^{st}$ order diffraction beam 304b by the device mask elements 202 is equal to (or approximately equal to) the incidence angle 406 of illumination from the first illumination pole 304 (and thus equal to the angle 406 of the 0-order diffraction beam 304a). Similarly, FIG. 4B is a conceptual view of lithography sub-system 102 illustrating the symmetric collection of the 0-order diffraction beam 306a and the 1$^{st}$ order diffraction beam 306b from the device mask elements 202 and the symmetric illumination of the sample 124, in accordance with one or more embodiments of the present disclosure. Accordingly, the illumination profile of the lithography illumination source 112 may be designed such that the diffraction angle 408 of the 1$^{st}$ order diffraction beam 306b by the device mask elements 202 is equal to (or approximately equal to) the incidence angle 410 of illumination from the second illumination pole 306 (and thus equal to the angle 410 of the 0-order diffraction beam 306a).

Figure 4C:
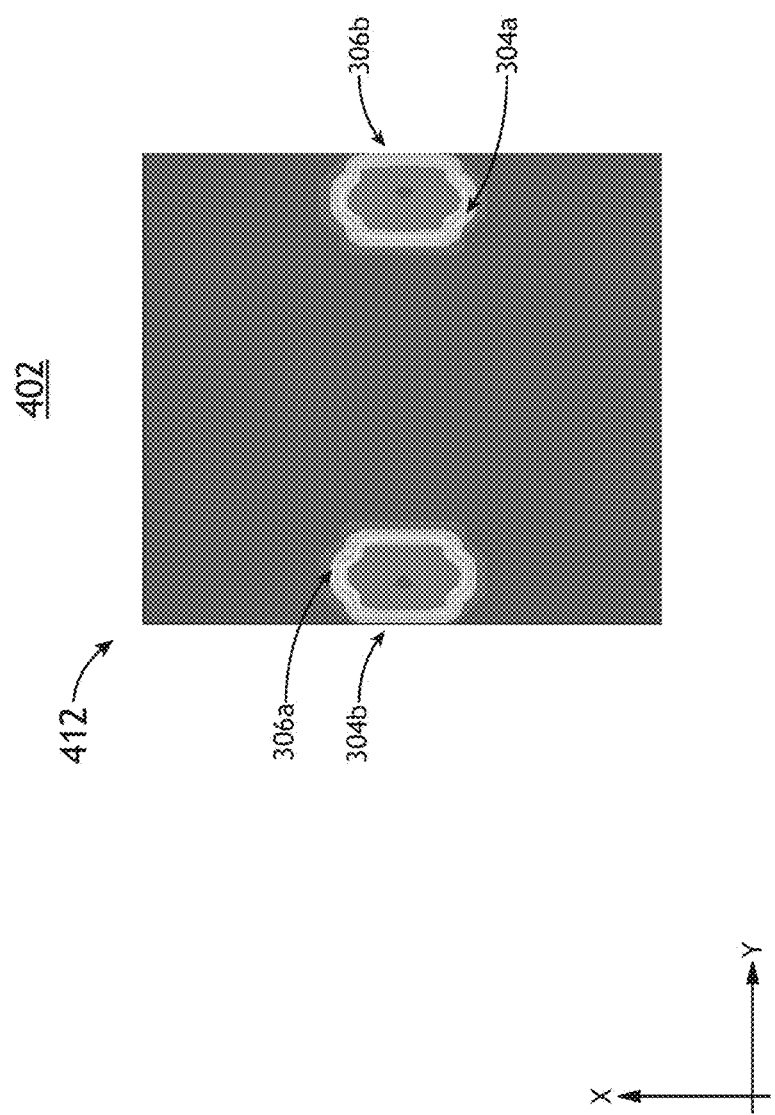
FIG. 4C is a plot of a symmetric profile of collected illumination from the device mask elements in a pupil plane, in accordance with one or more embodiments of the present disclosure.

FIG. 4C is a plot 412 of a symmetric profile of collected illumination from the device mask elements 202 in the pupil plane 402, in accordance with one or more embodiments of the present disclosure. In one embodiment, the 0-order diffraction beam 304a and the 1$^{st}$ order diffraction beam 306b are symmetrically distributed about the optical axis 116 with respect to the 0-order diffraction beam 306a and the 1$^{st}$ order diffraction beam 304b. For example, the 0-order diffraction beam 304a and the 1$^{st}$ order diffraction beam 306b may at least partially overlap. Similarly, the 0-order diffraction beam 306a and the 1$^{st}$ order diffraction beam 304b may at least partially overlap. In this regard, as illustrated in FIG. 4C, the combined distribution of illumination in the pupil plane 402 may be dipolar.

The image of the device mask elements 202 may depend on the particular diffraction orders of illumination present in the pupil plane 402 (e.g. the particular diffraction orders of illumination diffracted by the device mask elements 202 and collected by the projection optics 122). In general, the lithography sub-system 102 may operate as a spatial filter such that the spatial frequency content of the aerial image depends on the particular diffraction orders of illumination present in the pupil plane 402.

Figures 5A, 5B:
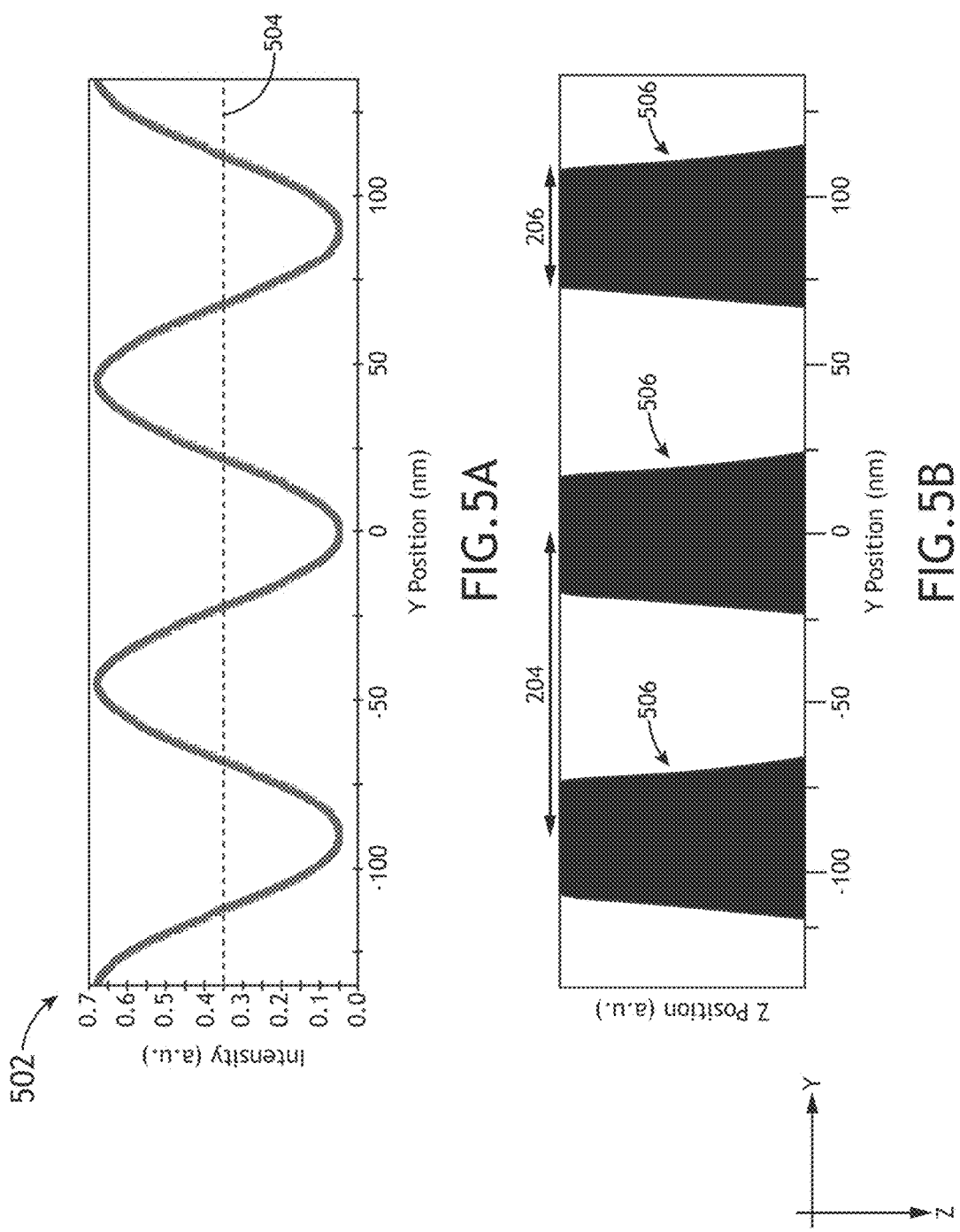
FIG. 5A is a plot of an aerial image of device mask elements on a sample based on the plot of collected illumination in the pupil plane in FIG. 4C for a sample at a nominal focal position during a lithography step, in accordance with one or more embodiments of the present disclosure.
FIG. 5B is a simulated profile view of printed device elements on a sample corresponding to device mask elements based on the aerial image of FIG. 5A, in accordance with one or more embodiments of the present disclosure.

FIG. 5A is a plot 502 of an aerial image of the device mask elements 202 on a sample based on the plot of collected illumination in the pupil plane 402 in FIG. 4C for a sample at a nominal focal position during a lithography step, in accordance with one or more embodiments of the present disclosure. Accordingly, FIG. 5A may represent an aerial image of the device mask elements 202 generated by the lithography sub-system 102. In one embodiment, the symmetric profile of collected illumination from the device mask elements 202 in the pupil plane 402 provides a periodic intensity distribution on the sample along the Y-direction (e.g. the direction of the device pitch 204). As illustrated in FIG. 5A, the image of the device mask elements 202 on the sample may include a subset of the spatial frequency content associated with the actual device mask elements 202 being imaged. For example, the aerial image of the device mask elements 202 in FIG. 5A based on 0-order and 1st-order diffraction from two symmetric illumination poles may include a periodic distribution of illumination with the same period as the device mask elements 202 (e.g. an inverse of the device pitch 204), but may include a more rounded profile due to the lack of higher-order diffracted orders.

The profile of elements printed on a sample may be based on both the aerial image of pattern mask elements used to expose the sample as well as the photosensitivity characteristics of the sample (e.g. a resist layer 128, or the like). For example, the degree to which the etch resistance of a sample layer changes may vary based on the intensity and/or dose of illumination during a lithographic exposure step. In one embodiment, the intensity of the aerial image is adjusted such that the intensity distribution of the aerial image is symmetric about an aerial image threshold 504 defining a threshold intensity for modifying the etch resistance of the sample.

FIG. 5B is simulated a profile view of printed device elements 506 on a sample corresponding to the device mask elements 202 based on the aerial image of FIG. 5A, in accordance with one or more embodiments of the present disclosure. In one embodiment, the sample 124 is etched in a positive etch process such that regions of the sample 124 exposed to relatively more intense illumination (e.g. associated with an aerial image) are modified to have a reduced resistance to a subsequent etching step. In this regard, portions of the sample 124 exposed to relatively more intense illumination may be removed during the etching step. The printed device elements 506 may be fabricated with the device pitch 204 based on the distribution of illumination in the aerial image (e.g. as illustrated in FIG. 5a). For example, the lithography sub-system 102 may be configured to include immersion projection optics 122 having a numerical aperture (NA) of 1.35 and a lithography illumination source 112 having a wavelength of 193 nm to generate the aerial image of FIG. 5A and fabricate the printed device elements 506 of FIG. 5B.

Further, the printed device elements 506 may be fabricated to have a critical dimension associated with the designed device width 206. For example, as illustrated in FIG. 5B, the critical dimension may be measured at the top of the printed device elements 506. By way of another example, the critical dimension may be measured at any height. In this regard, various aspects of the lithography process such as, but not limited to, the illumination profile, the illumination intensity, the exposure time, or the aerial image threshold associated with the sample may be adjusted such that the dimensions of the printed device elements 506 correspond to the dimensions of the device mask elements 202.

As described previously herein, illuminating a sample with symmetric illumination (e.g. as part of exposure with an aerial image) may provide for printed elements that are relatively insensitive to the focal position of the sample during the lithography step. Such a configuration may be particularly beneficial for the printing of device elements (e.g. printed device elements 506) associated with the device being fabricated.

Figure 6:
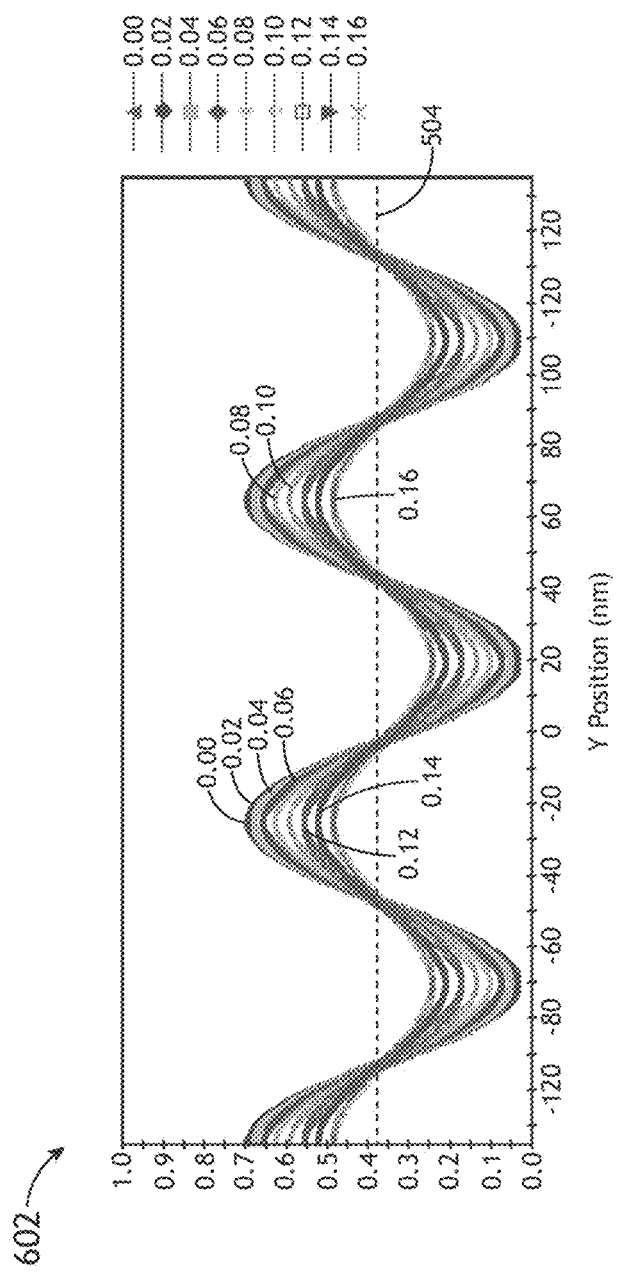
FIG. 6 is a plot of the intensity of aerial images of the device mask elements on a sample based on the plot of collected illumination in the pupil plane in FIG. 4C for varying focal positions of a sample during a lithography step, in accordance with one or more embodiments of the present disclosure.

FIG. 6 is a plot 602 of the intensity of aerial images of the device mask elements 202 on a sample 124 based on the plot of collected illumination in the pupil plane 402 in FIG. 4C for varying focal positions of a sample during a lithography step, in accordance with one or more embodiments of the present disclosure. In one embodiment, the intensity of an aerial image of the device mask elements 202 remains symmetric about the aerial image threshold 504 as the focal position of the sample 124 changes. Further, as illustrated in FIG. 6, the relative position of the aerial image along the Y direction may remain constant as the focal position of the sample 124 changes. In this regard, the device mask elements 202 in conjunction with the configuration of the lithography sub-system 102 may provide focus-insensitive fabrication of printed elements (e.g. printed device elements 506). Accordingly, characteristics of printed elements such as, but not limited to, critical dimensions, periodicity, feature placement (pattern placement error), or sidewall angle may exhibit relatively small changes that are within specified tolerances in response to deviations of the focal position of the sample.

In contrast, it may be desirable to fabricate focus-sensitive metrology targets such that characteristics of printed elements such as, but not limited to, critical dimensions, periodicity, feature placement (pattern placement error), or sidewall angle exhibit relatively large changes in response to deviations of the focal position of the sample. In this regard, a focus-sensitive metrology target may provide a mechanism for monitoring and/or controlling the focal position of the sample. Further, it may be desirable to fabricate focus-sensitive metrology targets on the same layer of a sample as focus-insensitive device elements (e.g. printed device elements 506, or the like) using the same lithography conditions (e.g. illumination profile of the lithography illumination source 112, configuration of the projection optics 122, and the like).

FIG. 7 is a top view of a pattern mask containing focus-sensitive mask elements for the fabrication of focus-sensitive printed elements based on a pre-defined illumination profile of an illumination source, in accordance with one or more embodiments of the present disclosure. In one embodiment, focus-sensitive mask elements 702 of pattern mask 120 are designed to provide focus-sensitive printed elements on the sample 124 under the same lithography conditions (e.g. illumination profile of the lithography illumination source 112, configuration of the projection optics 122, and the like) as the focus-insensitive device mask elements 202. In a general sense, however, focus-sensitive mask elements may be designed to provide focus-sensitive printed elements based on any known configuration of an illumination profile and lithography system.

The size, shape, and/or distribution of the focus-sensitive mask elements 702 may be selected to provide a distribution of illumination in the pupil plane 402 such that exposure of the sample 124 generates focus-sensitive printed elements. In one embodiment, the focus-sensitive mask elements 702 are distributed with a focus-sensitive pitch 704 selected to diffract illumination from the lithography illumination source 112 such that the diffraction orders associated with each illumination pole of the lithography illumination source 112 collected by the projection optics 122 are asymmetrically distributed in the pupil plane 402. It is noted herein that the asymmetric illumination of the sample 124 (e.g., exposure of the sample 124 with an aerial image of the focus-sensitive mask elements 702 generated by an asymmetric distribution of diffraction orders from the pattern mask 120) may generate an asymmetric exposure profile of the sample 124. Accordingly, development of the sample (e.g., the resist layer 128, or the like) may generate asymmetric printed elements having one or more characteristics (e.g., a position of the top of the corresponding printed element, a critical dimension associated with the separation of printed elements, one or more sidewall angles, or the like) that vary as a function of the focal position of the sample 124 along the optical axis 116. In this regard, the corresponding printed elements may operate as focus-sensitive printed elements. In another embodiment, the focus-sensitive mask elements 702 have a focus-sensitive width 706 along the direction of the focus-sensitive pitch 704 selected such that the intensities of the collected diffraction orders are balanced. It is further noted herein that the closer the relative intensities of collected diffraction orders of each illumination pole, the more sensitive printed elements may be to changes in the focal position of the sample.

FIGS. 8A and 8B are conceptual views of a lithography system for exposing a sample with an image of the focus-sensitive mask elements 702 generated by collected orders of illumination diffracted by the focus-sensitive mask elements 702 (e.g. an aerial image), in accordance with one or more embodiments of the present disclosure. In one embodiment, the focus-sensitive mask elements 702 diffract illumination from the first illumination pole 304 to generate multiple diffraction beams including, but not limited to, a 0-order diffraction beam 304$a$, a $1^{st}$ order diffraction beam 304$b$, and a $2^{nd}$ order diffraction beam 304$c$. In another embodiment, the device mask elements 202 diffract illumination from the second illumination pole 306 to generate multiple diffraction beams including, but not limited to, a 0-order diffraction beam 306$a$, a $1^{st}$ order diffraction beam 306$b$, and a $2^{nd}$ order diffraction beam 306$c$. Accordingly, the lithography sub-system 102 may be configured such that diffracted orders of illumination from the focus-sensitive mask elements 702 are asymmetrically distributed in the pupil plane 402.

FIG. 8A is a conceptual view of lithography sub-system 102 illustrating the asymmetric collection of the 0-order diffraction beam 304$a$ and the $1^{st}$ order diffraction beam 304$b$ from the focus-sensitive mask elements 702 and the asymmetric illumination of the sample 124, in accordance with one or more embodiments of the present disclosure. For example, the illumination profile of the lithography illumination source 112 may be designed such that the diffraction angle 802 of the $1^{st}$ order diffraction beam 304$b$ by the focus-sensitive mask elements 702 is substantially different than the incidence angle 804 of illumination from the first illumination pole 304 (and thus substantially different than the angle 804 of the 0-order diffraction beam 304$a$). For example, illumination from one diffraction order (e.g. a 0-order diffraction beam, a $1^{st}$-order diffraction beam, a $2^{nd}$-order diffraction beam, or the like) may be located near the edge of the pupil plane 402, and illumination from an additional diffraction order (e.g. a 0-order diffraction beam, a $1^{st}$-order diffraction beam, a $2^{nd}$-order diffraction beam, or the like) may be located near the center of the pupil plane 402. In this regard, the optical path lengths of the asymmetrically-distributed diffraction beams may be substantially different.

Similarly, FIG. 8B is a conceptual view of lithography sub-system 102 illustrating the asymmetric collection of the 0-order diffraction beam 306$a$ and the $1^{st}$ order diffraction beam 306$b$ from the focus-sensitive mask elements 702 and the asymmetric illumination of the sample 124, in accordance with one or more embodiments of the present disclosure. Accordingly, the illumination profile of the lithography illumination source 112 may be designed such that the diffraction angle 806 of the $1^{st}$ order diffraction beam 306$b$ by the device mask elements 202 is substantially different than incidence angle 808 of illumination from the second illumination pole 306 (and thus substantially different than the angle 808 of the 0-order diffraction beam 306$a$).

In another embodiment, illumination associated with each illumination pole of the lithography illumination source 112 is asymmetrically distributed in the pupil plane 402, but the cumulative distribution of illumination in the pupil plane 402 is symmetrically distributed. Correspondingly, illumination associated with each illumination pole of the lithography illumination source 112 is asymmetrically incident on the sample 124, but the cumulative distribution of illumination on the sample 124 is symmetric. For example, a symmetric distribution of illumination poles (e.g. as illustrated in FIG. 3) may produce a symmetric distribution of illumination in the pupil plane 402 although the contributions from each illumination pole (e.g. first illumination pole 304 and second illumination pole 306) may be asymmetric. It is noted herein that pattern mask elements (e.g. focus-sensitive mask elements 702) that produce asymmetric contributions to the pupil plane 402 and thus asymmetric contributions to sample illumination may generate focus-sensitive printed elements regardless of whether or not the cumulative distribution of illumination in the pupil plane 402 is symmetric. For example, pattern mask elements that produce asymmetric contributions to the pupil plane 402 may generate focus-sensitive printed elements that exhibit focus-sensitive variations of one or more sidewall angles or one or more critical dimensions.

In another embodiment, a pitch of focus-sensitive mask elements 702 (e.g. the focus-sensitive pitch 704) is selected to provide an asymmetric distribution of illumination associated with each illumination pole of a lithography illumination source 112. For example, a lithography sub-system 102 may be configured to have an illumination profile to provide focus-insensitive printed device elements based on a known distribution of pattern elements on a pattern mask (e.g. device mask elements 202). Further, the pitch of the focus-sensitive mask elements 702 of a pattern mask may be selected to provide an asymmetric distribution of illumination associated with each illumination pole based on this particular configuration. In this regard, the pattern mask may include both focus-insensitive mask elements (e.g. device mask elements 202) and focus-sensitive mask elements (e.g. focus-sensitive mask elements 702) printable using a common illumination profile.

Figure 8C:
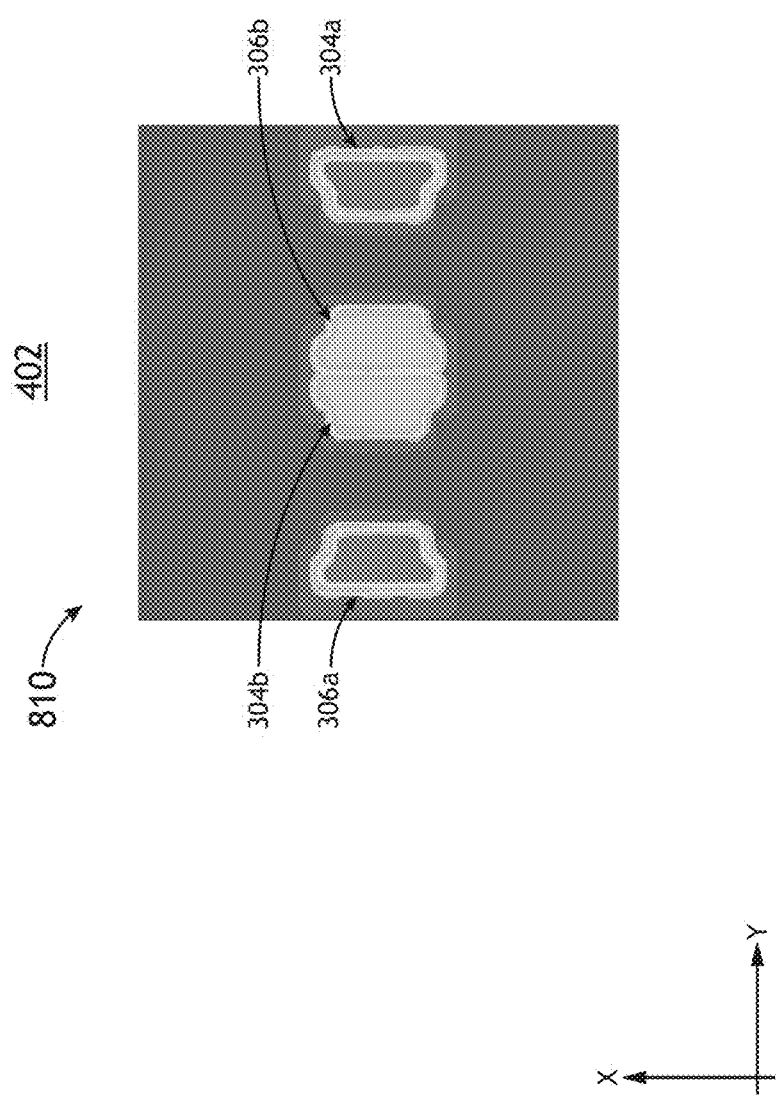
FIG. 8C is a plot illustrating a distribution of illumination in a pupil plane for focus-sensitive mask elements with a selected focus-sensitive pitch of 160 nm, in accordance with one or more embodiments of the present disclosure.

FIGS. 8C and 8D are exemplary plots of illumination in the pupil plane 402 for the fabrication of focus-sensitive printed elements based on the illumination profile of FIG. 3 configured for the focus-insensitive device mask elements 202. For example, the illumination profile of FIG. 3 may be configured for the focus-insensitive device mask elements 202 having a device pitch 204 of 90 nm. Accordingly, the focus-sensitive pitch 704 may be, but is not required to be, selected from a range of approximately 150 nm to 190 nm.

FIG. 8C is a plot 810 illustrating a distribution of illumination in the pupil plane 402 for focus-sensitive mask elements 702 with a selected focus-sensitive pitch 704 of 160 nm, in accordance with one or more embodiments of the present disclosure. As illustrated in FIG. 8C, the 0-order diffraction beam 304a may be located near the edge of the pupil plane 402, while the $1^{st}$ order diffraction beam 304b may be located near the center of the pupil plane 402 on the opposite side of the optical axis 116. Accordingly, the 0-order diffraction beam 304a and the $1^{st}$ order diffraction beam 304b are asymmetrically distributed in the pupil plane 402. Further, the optical path lengths of the 0-order diffraction beam 304a and the $1^{st}$ order diffraction beam 304b are substantially different (e.g. see FIG. 8A). Similarly, the 0-order diffraction beam 306a may be located near the edge of the pupil plane 402, while the $1^{st}$ order diffraction beam 306b may be located near the center of the pupil plane 402 on the opposite side of the optical axis 116. Accordingly, the 0-order diffraction beam 306a and the $1^{st}$ order diffraction beam 306b are asymmetrically distributed in the pupil plane 402. Further, the optical path lengths of the 0-order diffraction beam 306a and the $1^{st}$ order diffraction beam 306b are substantially different (e.g. see FIG. 8B).

FIG. 8D is a plot 812 illustrating a distribution of illumination in the pupil plane 402 for focus-sensitive mask elements 702 with a selected focus-sensitive pitch 704 of 180 nm, in accordance with one or more embodiments of the present disclosure. As illustrated in FIG. 8C, the 0-order diffraction beam 304a may be located near the edge of the pupil plane 402, while the $1^{st}$ order diffraction beam 304b may be located near the center of the pupil plane 402 and overlapping the optical axis 116. Accordingly, the 0-order diffraction beam 304a and the $1^{st}$ order diffraction beam 304b are asymmetrically distributed in the pupil plane 402. Further, the optical path lengths of the 0-order diffraction beam 304a and the $1^{st}$ order diffraction beam 304b are substantially different (e.g. see FIG. 8A). Similarly, the 0-order diffraction beam 306a may be located near the edge of the pupil plane 402, while the $1^{st}$ order diffraction beam 306b may be located near the center of the pupil plane 402 and overlapping the optical axis 116. Accordingly, the 0-order diffraction beam 306a and the $1^{st}$ order diffraction beam 306b are asymmetrically distributed in the pupil plane 402. Further, the optical path lengths of the 0-order diffraction beam 306a and the $1^{st}$ order diffraction beam 306b are substantially different (e.g. see FIG. 8B).

The image of the device mask elements 202 may depend on the particular diffraction orders of illumination present in the pupil plane 402 (e.g. the particular diffraction orders of illumination diffracted by the device mask elements 202 and collected by the projection optics 122). In general, the lithography sub-system 102 may operate as a spatial filter such that the spatial frequency content of the aerial image depends on the particular diffraction orders of illumination present in the pupil plane 402.

It is noted herein that the relative intensities of collected diffraction orders (e.g. in the pupil plane 402) may impact the degree to which printed features may be sensitive to variations of the focal position of the sample. For example, it may be desirable that two asymmetrically-distributed collected diffraction orders (e.g. associated with a common illumination pole) have similar intensities such that the relative contributions of each diffraction order are balanced. In this regard, the impact of the asymmetric distribution of diffraction orders in the pupil plane 402 may be strong. It is further noted herein that the width of pattern mask elements along a pitch direction may affect the relative intensities of diffracted orders of illumination diffracted by the pattern mask elements.

Figure 9:
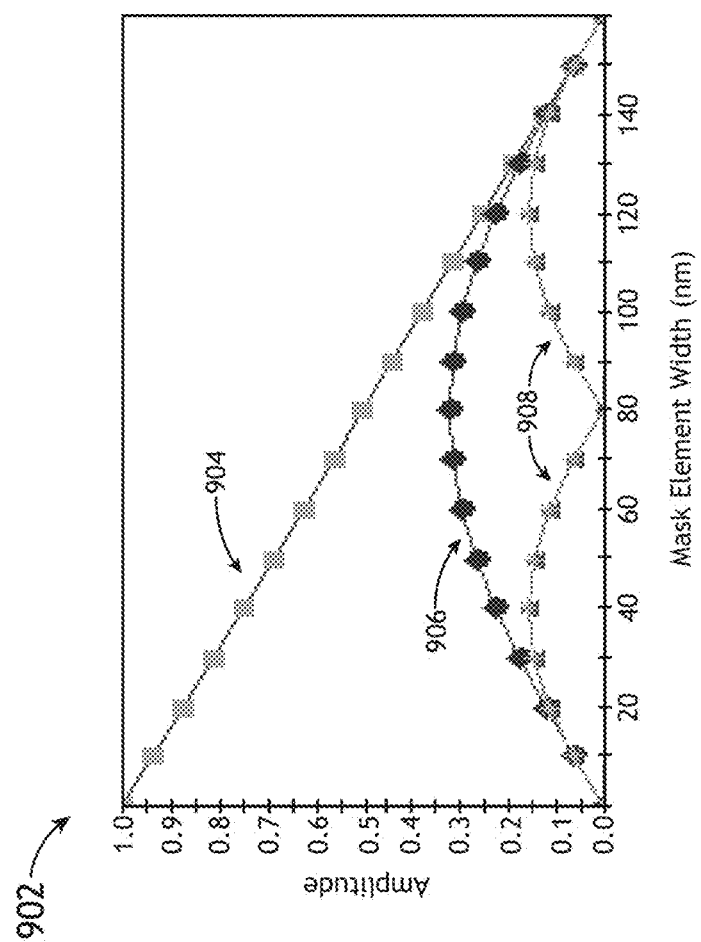
FIG. 9 is a plot of the relative intensities of collected diffracted orders of illumination for pattern mask elements having a pitch of 160 nm as a function of the mask element width along the pitch direction, in accordance with one or more embodiments of the present disclosure.

FIG. 9 is a plot 902 of the relative intensities of collected diffracted orders of illumination for pattern mask elements having a pitch of 160 nm as a function of the mask element width along the pitch direction, in accordance with one or more embodiments of the present disclosure. In one embodiment, the relative intensity of 0-order diffraction is shown as line 904, the relative intensity of ±1-order diffraction is shown as line 906, and the relative intensity of ±2-order diffraction is shown as line 908. Additional diffraction orders generated by the pattern mask but not collected by the projection optics 122 (e.g. not present in the pupil plane 402) are not shown in FIG. 9. As illustrated in FIG. 9, a mask element width of 0 provides no diffraction and the full illumination beam (e.g. an illumination pole) propagates through the pattern mask undiffracted. At the other extreme, for a mask element width of 160 nm (e.g. the pitch of mask elements), the pattern mask fully blocks the illumination beam. For mask element width values between 0 nm and 160 nm, the relative intensities of collected diffraction orders may vary. For example, the relative intensity of collected 0-order diffraction may linearly decrease with increasing mask element width; the relative intensity of collected ±1-order diffraction may peak at a mask element width of 80 nm (e.g. a line-space ratio of 1) and drop off at 0 nm and 160 nm mask element widths; and the relative intensity of collected ±2-order diffraction may peak at 40 nm (e.g. a line-space ratio of 1/3) and 120 nm (e.g. a line-space ratio of 3/1) and drop off at mask element widths of 0 nm, 80 nm, and 160 nm.

As illustrated in FIG. 9, selecting a focus-sensitive width 706 to be half of the focus-sensitive pitch 704 (e.g. a line-space ratio of 1) may provide for strong asymmetry of collected diffraction orders associated with each illumination pole by suppressing the collection of unwanted diffraction orders (e.g. the ±2-order diffraction in this example). However, the 0-order diffraction may have a significantly higher relative intensity than the ±1-order diffraction (e.g. ~0.5 compared to ~0.3 as illustrated in FIG. 9). In this regard, the impact of the asymmetric distribution of collected diffracted orders may be reduced by the disparity between the relative intensities of the collected diffraction orders, which may negatively impact the focus-sensitivity of the focus-sensitive mask elements 702.

In another embodiment, a focus-sensitive width 706 of the focus-sensitive mask elements 702 along the direction of the focus-sensitive pitch 704 (e.g. the focus-sensitive width 706) is selected to simultaneously minimize the relative intensity of unwanted diffraction orders (e.g. the ±2-order diffraction in the example illustrated in FIG. 9) and equalize the relative intensities of desired diffraction orders (e.g. 0-order diffraction and ±1-order diffraction in the example illustrated in FIG. 9) within a specified tolerance to provide focus-sensitive printed elements on a sample. In this regard, the focus-sensitive width 706 may be selected to optimize the sensitivity of printed pattern elements to the focal position of the sample 124 in the lithography sub-system 102 during a lithography process step.

In another embodiment, the focus-sensitive width 706 may be selected such that the line-space ratio is not equal to 1 to equalize the relative intensities of collected diffraction orders within a specified tolerance and increase the focus-sensitivity of the focus-sensitive mask elements 702. For example, the focus-sensitive width 706 may be selected such that the line-space ratio is greater than 1. Accordingly, a portion of one or more unwanted diffraction orders (e.g. a ±2-order diffraction beam in this example) may be collected, which may diminish the asymmetry of the distribution of collected diffracted orders. However, any negative effects of collecting unwanted diffraction orders may be compensated and/or overcome by the at least partial equalization of the relative intensities of collected diffraction orders.

It is noted that the terms "optimize," "maximize," "equalize" and the like are used within the present disclosure to signify manipulation of aspects of pattern mask elements (e.g. a pitch, a width along the pitch direction, or the like) such that printed elements fabricated on a sample have a sensitivity to the sample focal position at or near target values within design tolerances. Further, optimization, maximization, equalization, or the like need not require achieving a single "best" value. Rather, optimization may provide an acceptable value signifying performance within certain constraints. It may be the case that the relative intensities of collected diffraction orders may be fully equalized by adjusting the focus-sensitive width 706 (e.g. see FIG. 9). However, it may be the case that the value of the focus-sensitive width 706 may be selected to provide an optimal focus-sensitivity by balancing the distribution of collected diffraction orders (e.g. the degree of asymmetry) with the relative intensities of collected diffraction orders.

Figure 10A:
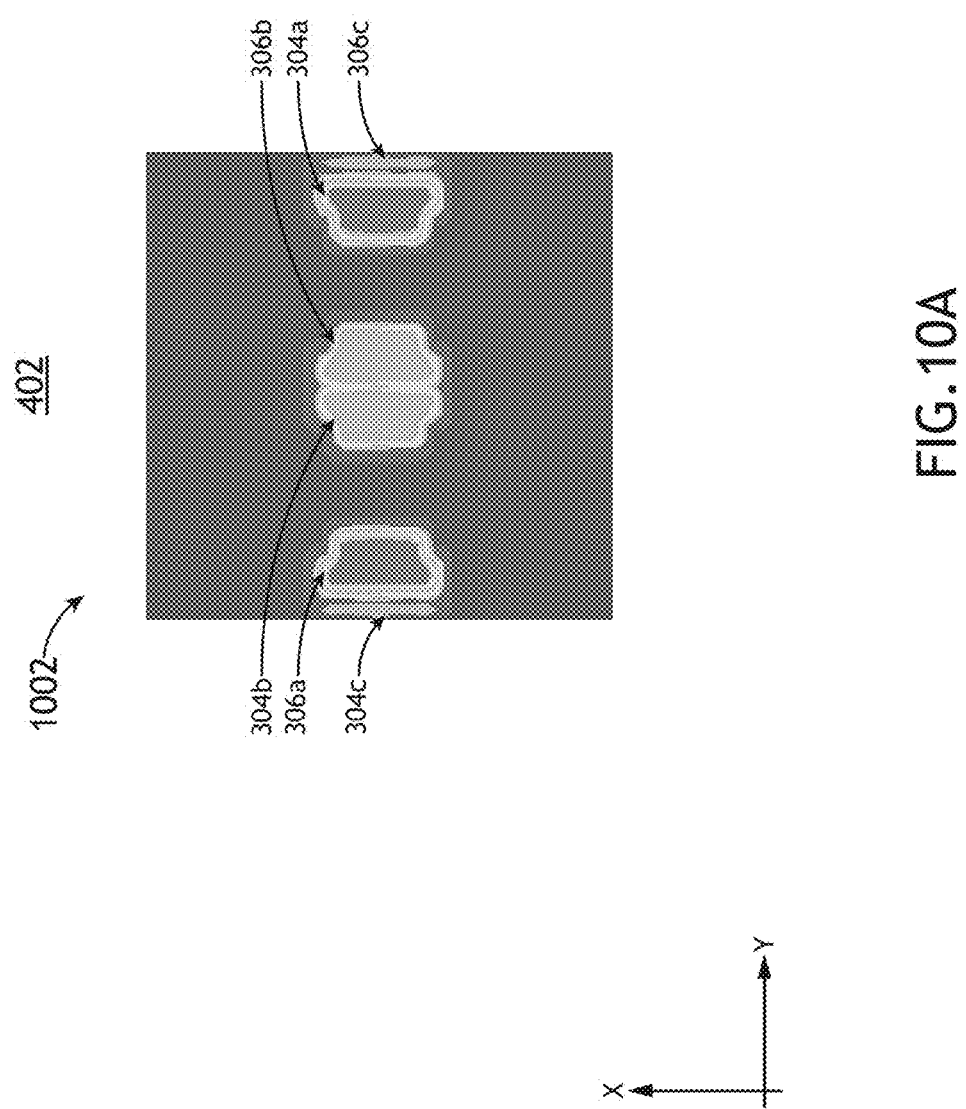
FIG. 10A is a plot of the distribution of illumination in a pupil plane for focus-sensitive mask elements distributed with a focus-sensitive pitch of 160 nm and a focus-sensitive width of 60 nm, in accordance with one or more embodiments of the present disclosure.
Figure 10B:
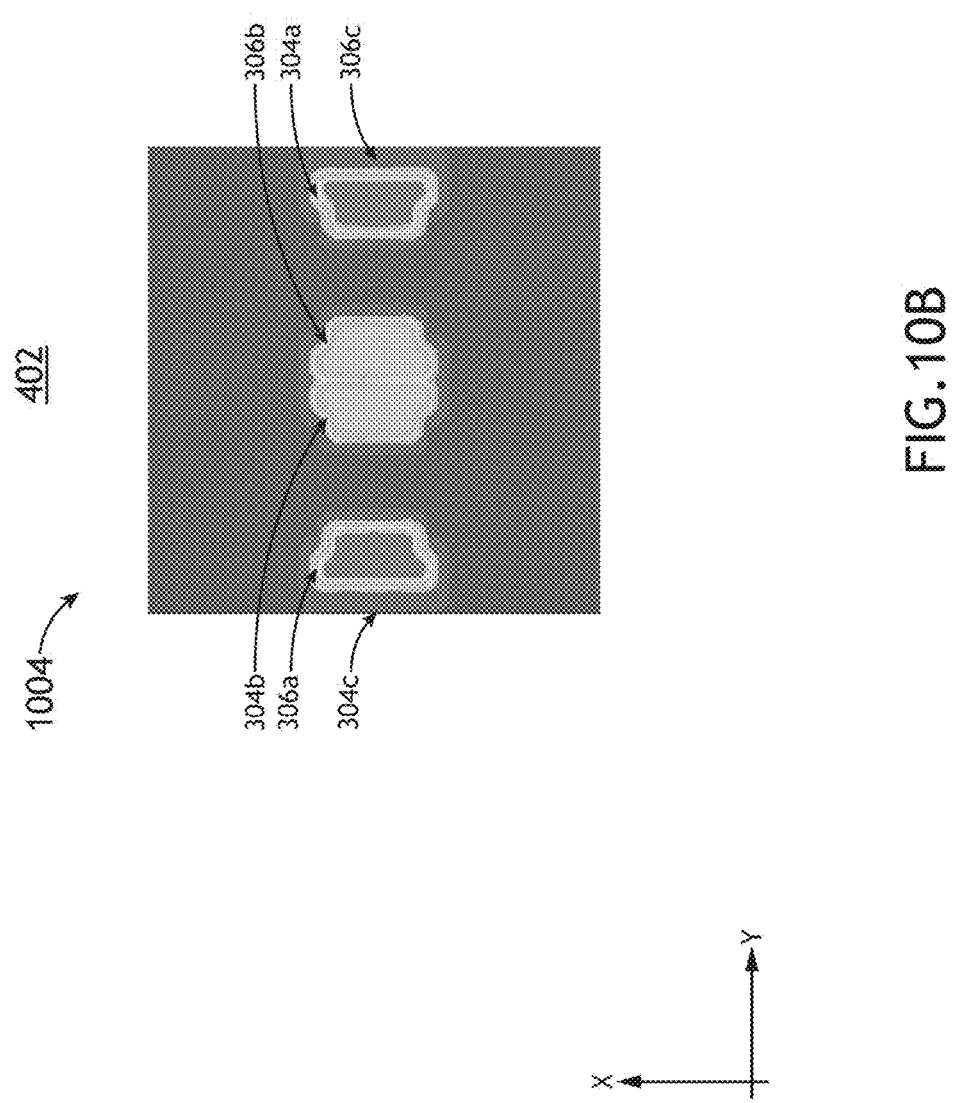
FIG. 10B is a plot of the distribution of illumination in a pupil plane for focus-sensitive mask elements distributed with a focus-sensitive pitch of 160 nm and a focus-sensitive width of 80 nm, in accordance with one or more embodiments of the present disclosure.
Figure 10C:
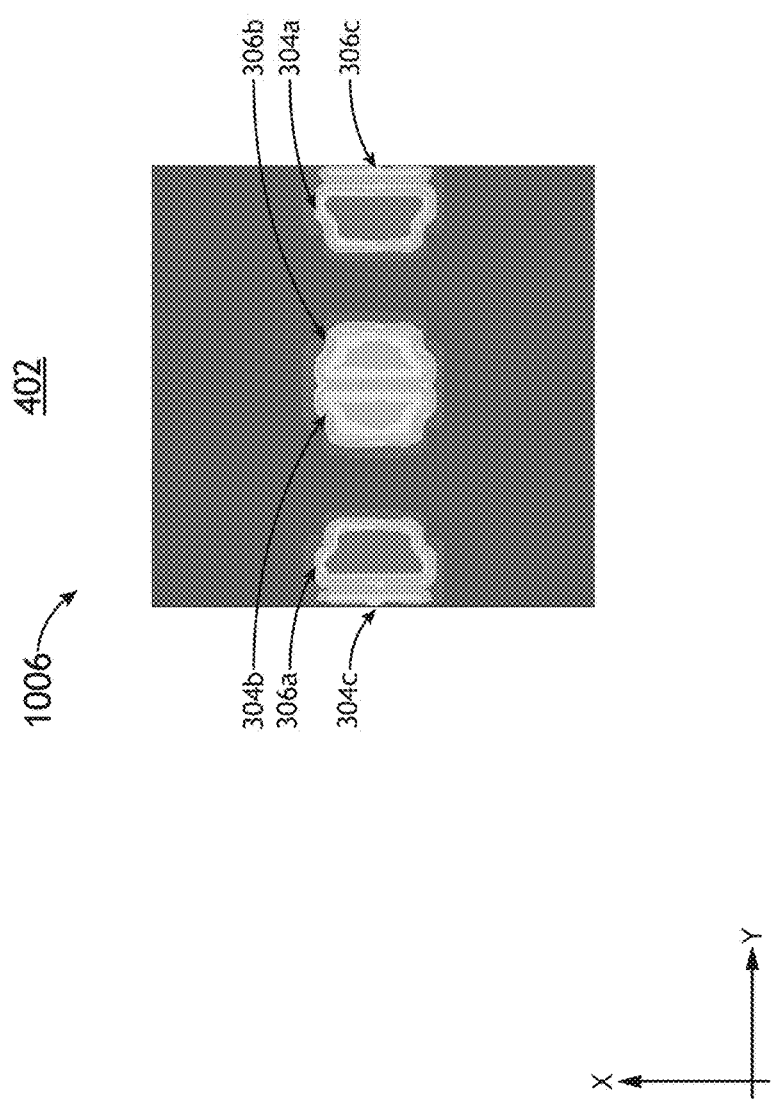
FIG. 10C is a plot of the distribution of illumination in a pupil plane for focus-sensitive mask elements distributed with a focus-sensitive pitch of 160 nm and a focus-sensitive width of 100 nm, in accordance with one or more embodiments of the present disclosure.

FIG. 10A is a plot 1002 of the distribution of illumination in the pupil plane 402 for focus-sensitive mask elements 702 distributed with a focus-sensitive pitch 704 of 160 nm and a focus-sensitive width 706 of 60 nm (e.g. a line-space ratio of 3/5), in accordance with one or more embodiments of the present disclosure. FIG. 10B is a plot 1004 of the distribution of illumination in the pupil plane 402 for focus-sensitive mask elements 702 distributed with a focus-sensitive pitch 704 of 160 nm and a focus-sensitive width 706 of 80 nm (e.g. a line-space ratio of 1), in accordance with one or more embodiments of the present disclosure. FIG. 10C is a plot 1006 of the distribution of illumination in the pupil plane 402 for focus-sensitive mask elements 702 distributed with a focus-sensitive pitch 704 of 160 nm and a focus-sensitive width 706 of 100 nm (e.g. a line-space ratio of 5/3), in accordance with one or more embodiments of the present disclosure. In one embodiment, the relative intensities of diffracted orders of illumination in FIGS. 10A through 10C correspond to those plotted in FIG. 9.

As illustrated in FIGS. 10A through 10C, selecting the focus-sensitive width 706 to be 80 nm (e.g. a line-space ratio of 1) as shown in FIG. 10B may provide the greatest asymmetry in the distribution of collected diffraction orders associated with each illumination pole by suppressing the ±2-order diffraction (e.g. the $2^{nd}$ order diffraction beam 304$c$ and the $2^{nd}$ order diffraction beam 306$c$). However, the relative intensities of the 0-order and the ±1-order diffraction beams may be adjusted by selecting the focus-sensitive width 706. As illustrated in FIGS. 10A through 10C, the relative intensities of the 0-order and the ±1-order diffraction beams may be closer together (e.g. equalized) as the focus-sensitive width 706 is increased from 60 nm (e.g. FIG. 10A) to 100 nm (e.g. FIG. 10C). Accordingly, the focus-sensitive width 706 may be selected to balance the asymmetry of the illumination in the pupil plane 402 and equalizing the relative intensities of collected diffraction orders in the pupil plane 402 to provide focus-sensitivity within a specified tolerance.

The degree to which the relative intensities of diffraction orders may be equalized by the selection of the focus-sensitive width 706 may be determined as a design parameter based on a desired focus sensitivity of the focus-sensitive printed elements. It may be the case that no value of the focus-sensitive width 706 may completely equalize the relative intensities of desired diffracted orders in the pupil plane 402. For example, as illustrated in FIG. 9, the collected intensity of ±1 order diffraction (e.g. $1^{st}$ order diffraction beam 304$b$ or $1^{st}$ order diffraction beam 306$b$) is always lower than the intensity of 0-order diffraction (e.g. 0-order diffraction beam 304$a$ or 0-order diffraction beam 306$a$). Similarly, ±2 order diffraction (e.g. $2^{nd}$ order diffraction beam 304$c$ or $2^{nd}$ order diffraction beam 306$c$ is always lower than the intensity of ±1 order diffraction (e.g. $1^{st}$ order diffraction beam 304$b$ or $1^{st}$ order diffraction beam 306$b$). Accordingly, the focus-sensitive width 706 may be such that the difference between the intensities of two diffracted orders is within a selected range. For example, the range may be defined such that the difference between the intensities of two diffracted orders is within 30% of the largest intensity of the two diffracted orders. By way of another example, the range may be defined such that the difference between the intensities of two diffracted orders is within a range of 1% to 30% of the largest intensity of the two diffracted orders. Considering the examples illustrated in FIGS. 9 through 10C, selecting the focus-sensitive width 706 to be 60 nm (e.g. a line-space ratio of 3/5) brings the difference between the 0-order diffraction (e.g. line 904) and the ±1 order diffraction (line 906) to approximately 54% of the intensity of the 0-order diffraction. Selecting the focus-sensitive width 706 to be 80 nm (e.g. a line-space ratio of 3/5) brings the difference between the 0-order diffraction (e.g. line 904) and the ±1 order diffraction (line 906) to approximately 36% of the intensity of the 0-order diffraction. Selecting the focus-sensitive width 706 to be 100 nm (e.g. a line-space ratio of 3/5) brings the difference between the 0-order diffraction (e.g. line 904) and the ±1 order diffraction (line 906) to approximately 25% of the intensity of the 0-order diffraction. Accordingly, selecting the focus-sensitive width 706 to be 100 nm may fall within the specified range. Further, selecting the focus-sensitive width 706 in this manner may provide focus-sensitivity of a printed metrology target within a specified tolerance.

It is recognized that further increasing the focus-sensitive width 706 beyond 100 nm in the example illustrated by FIGS. 9 through 10C may bring the relative intensities of the desired diffraction orders (e.g. 0-order diffraction and ±1 order diffraction) closer together. However, as illustrated in FIG. 9, the relative intensity of unwanted diffraction orders (e.g. ±2 order diffraction) may increase such that focus-sensitivity is negatively impacted. Thus, the focus-sensitive width 706 may be selected to balance the distribution of collected diffraction orders (e.g. the degree of asymmetry) with the relative intensities of collected diffraction orders to provide highly sensitive focus-sensitive mask elements 702.

Figure 11A:
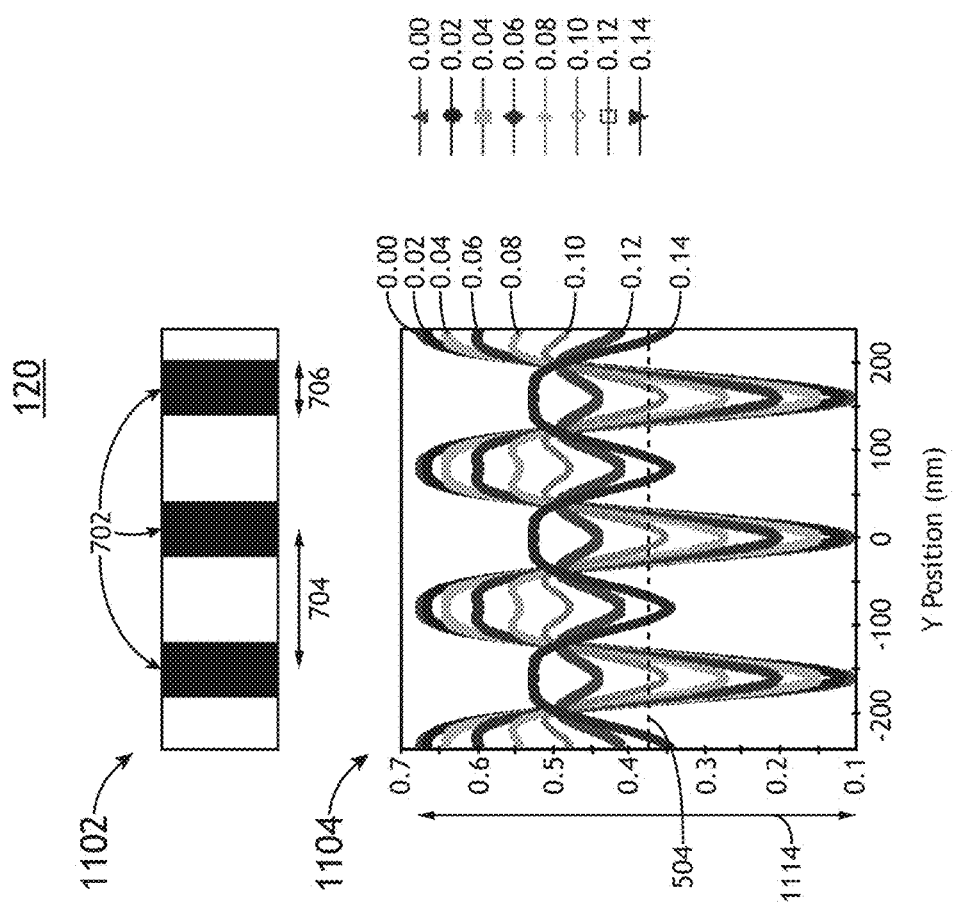
FIG. 11A includes a top view of focus-sensitive mask elements having a focus-sensitive pitch of 160 nm and a focus-sensitive width of 60 nm, and a plot of the corresponding aerial image as a function of the focal position of a sample, in accordance with one or more embodiments of the present disclosure.
Figure 11B:
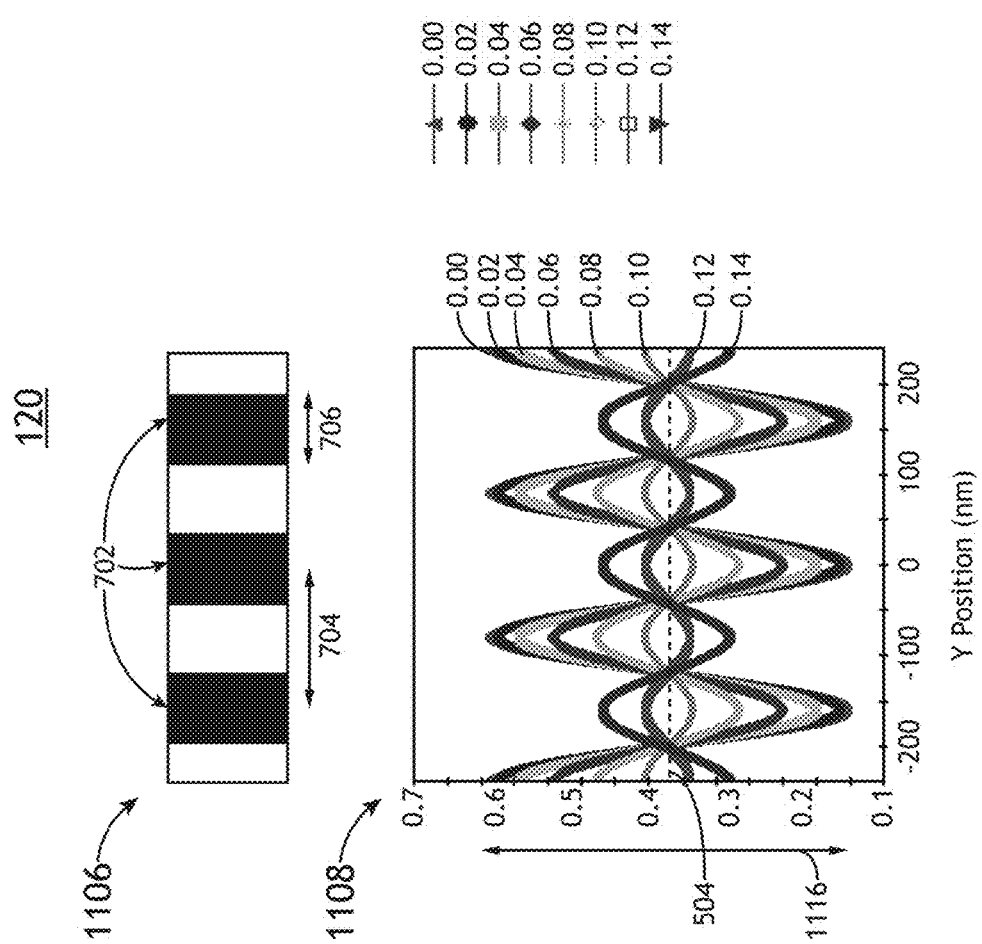
FIG. 11B includes a top view of focus-sensitive mask elements having a focus-sensitive pitch of 160 nm and a focus-sensitive width of 80 nm, and a plot of the corresponding aerial image as a function of the focal position of a sample, in accordance with one or more embodiments of the present disclosure.
Figure 11C:
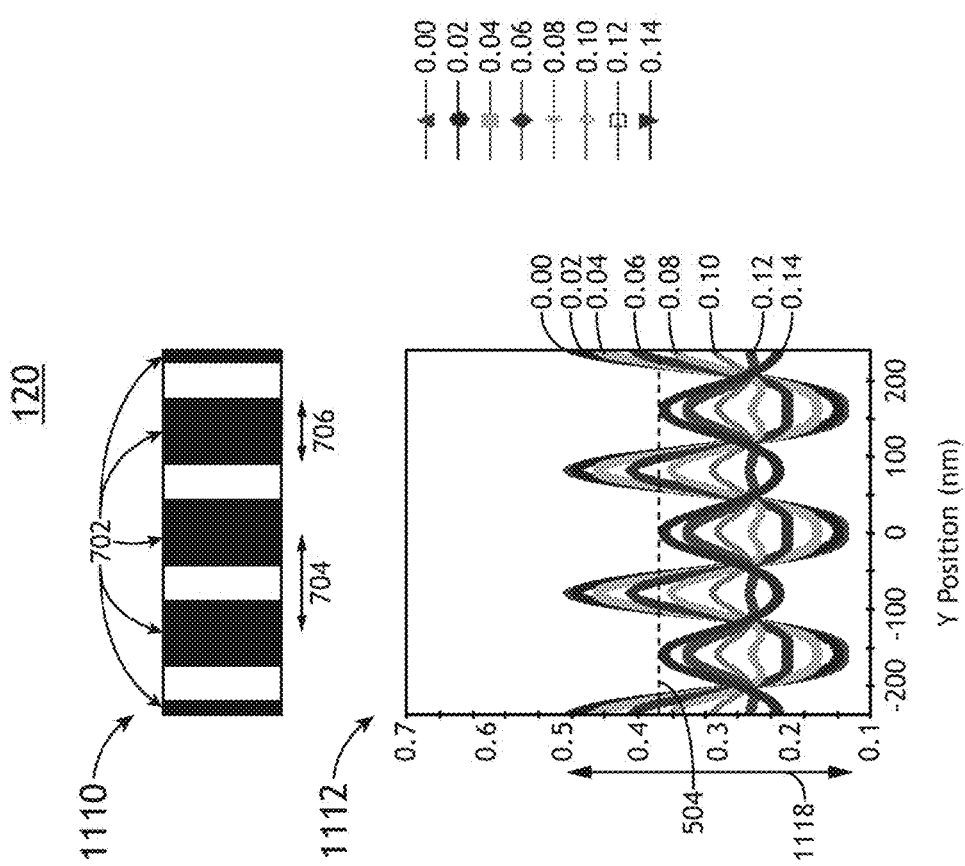
FIG. 11C includes a top view of focus-sensitive mask elements having a focus-sensitive pitch of 160 nm and a focus-sensitive width of 100 nm, and a plot of the corresponding aerial image as a function of the focal position of a sample, in accordance with one or more embodiments of the present disclosure.

FIGS. 11A through 11C illustrate variations of the aerial image intensity for pupil plane distributions in FIGS. 10A through 10C. FIG. 11A includes a top view 1102 of focus-sensitive mask elements 702 having a focus-sensitive pitch 704 of 160 nm and a focus-sensitive width 706 of 60 nm (see FIG. 10A), and a plot 1104 of the corresponding aerial image as a function of the focal position of the sample 124, in accordance with one or more embodiments of the present disclosure. FIG. 11B includes a top view 1106 of focus-sensitive mask elements 702 having a focus-sensitive pitch 704 of 160 nm and a focus-sensitive width 706 of 80 nm (see FIG. 10B), and a plot 1108 of the corresponding aerial image as a function of the focal position of the sample 124, in accordance with one or more embodiments of the present disclosure. FIG. 11C includes a top view 1110 of focus-sensitive mask elements 702 having a focus-sensitive pitch 704 of 160 nm and a focus-sensitive width 706 of 100 nm (see FIG. 10C), and a plot 1112 of the corresponding aerial image as a function of the focal position of the sample 124, in accordance with one or more embodiments of the present disclosure.

The variations of the peak-to-peak aerial image intensity as a function of the focal position of the sample 124 (e.g. the modulation depth) for FIGS. 11A through 11C are indicative of the depth of field associated with the fabrication of printed elements. In this regard, a smaller depth of field may correspond to increased focal sensitivity due to a decreased range of sample locations along the optical axis 116 suitable for fabrication. As illustrated in FIGS. 11A through 11C, in one embodiment, the modulation depth 1114 for the aerial image of FIG. 11A associated with focal deviations from 0 nm to 140 nm is approximately 0.58, the modulation depth 1116 for the aerial image of FIG. 11B associated with focal deviations from 0 nm to 140 nm is approximately 0.45, and the modulation depth 1118 for the aerial image of FIG. 11C associated with focal deviations from 0 nm to 140 nm is approximately 0.38. Accordingly, selecting the focus-sensitive width 706 such that the line-space ratio is greater than 1 (e.g. 100 nm as shown in FIG. 11C) may decrease the depth of field and thus increase the focal sensitivity of the associated focus-sensitive mask elements 702. Alternatively, selecting the focus-sensitive width 706 such that the line-space ratio is less than 1 (e.g. 60 nm as shown in FIG. 11A) may increase the depth of field and thus decrease the focal sensitivity of the associated focus-sensitive mask elements 702. In this regard, the focus-sensitive width 706 may be selected to balance the distribution of collected diffraction orders (e.g. the degree of asymmetry) with the relative intensities of collected diffraction orders to provide highly sensitive focus-sensitive mask elements 702.

As further illustrated by FIGS. 11A though 11C, the focus-sensitive width 706 may be selected to control the image-log slope (ILS), which is an additional measure of the focal sensitivity of the associated focus-sensitive mask elements 702. The image-log slope may be expressed as:

$$ILS = \frac{1}{I}\frac{dI}{dy} = \frac{d\ln(I)}{dy} \qquad (1)$$

where I is the aerial image intensity. Accordingly, a decreased ILS may provide relatively increased variations of printed characteristics of features (e.g., sidewall angle, critical dimension, or the like) associated with focus-sensitive mask elements 702 such that the focal position of the sample 124 may be sensitively determined. For instance, increasing the focus-sensitive width 706 from 60 nm to 100 nm corresponds to a decrease of the ILS of the associated aerial image and thus an increase in the focal sensitivity of printed focus-sensitive mask elements 702.

The focus-sensitive width 706 may be further selected to modify the intensity of the aerial image relative to the aerial image threshold 504 (e.g., the intensity threshold at which the sample 124 (e.g., a resist layer 128) may be sufficiently exposed so as to modify the etching resistance of the exposed portions of the sample). In the example illustrated in FIG. 11C for a selected focus-sensitive width 706 of 100 nm (e.g., a line-space ratio of 5/3), deviations of the sample from a nominal focal position greater than 60 nm may shift the aerial image intensity completely below the aerial image threshold 504 such that the sample 124 may not be sufficiently exposed and no structures may be fabricated. Accordingly, the focal sensitivity of the focus-sensitive mask elements 702 may be further increased.

In another embodiment, focus-sensitive mask elements 702 on a pattern mask 120 may be further distributed with a coarse pitch larger than the focus-sensitive pitch 704. In this regard, the pattern mask 120 may include groups of focus-sensitive mask elements 702 separated by a coarse space in which focus-sensitive mask elements 702 within each group may be distributed according to the focus-sensitive pitch 704. It is noted herein that segmenting focus-sensitive mask elements 702 in this manner may be particularly beneficial for metrology applications.

The value of the coarse space may be selected such that all groups of focus-sensitive mask elements 702 may provide a high degree of focus-sensitivity. In one embodiment, the value of the coarse pitch is selected to be at least twice the focus-sensitive pitch 704 to maintain high focus-sensitivity for all groups of focus-sensitive mask elements 702. For example, selecting a value of a coarse pitch to be larger than at least twice the focus-sensitive pitch 704 may provide high focus sensitivity for printed features associated with all focus-sensitive mask elements 702 in the pattern, particularly focus-sensitive mask elements 702 on the edge of each group.

Referring generally to FIGS. 12A through 14C, the focus sensitivity of focus-sensitive mask elements 702 distributed with a coarse pitch 1202 of 800 nm, a focus-sensitive pitch 704 of 160 nm as a function of the focus-sensitive width 706 is demonstrated, in accordance with one or more embodiments of the present disclosure.

Figure 12A:
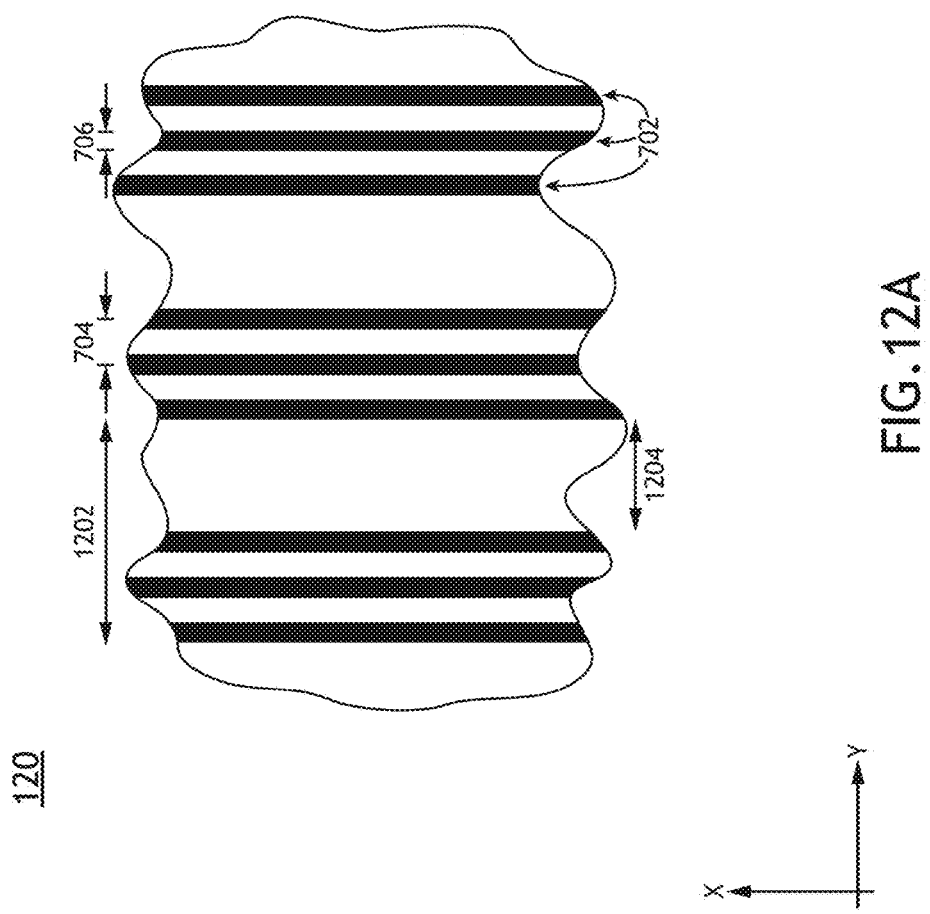
FIG. 12A is a top view of a portion of a pattern mask including groups of three focus-sensitive mask elements distributed with a coarse pitch of 800 nm, a coarse space of 420 nm, a focus-sensitive pitch of 160 nm, and a focus-sensitive width of 60 nm, in accordance with one or more embodiments of the present disclosure.

FIG. 12A is a top view of a portion of a pattern mask 120 including groups of three focus-sensitive mask elements 702 distributed with a coarse pitch 1202 of 800 nm, a coarse space 1204 of 420 nm, a focus-sensitive pitch 704 of 160 nm, and a focus-sensitive width 706 of 60 nm, in accordance with one or more embodiments of the present disclosure. FIG. 12B is a top view of a portion of a pattern mask 120 including groups of three focus-sensitive mask elements 702 distributed with a coarse pitch 1202 of 800 nm, a coarse space 1204 of 400 nm, a focus-sensitive pitch 704 of 160 nm, and a focus-sensitive width 706 of 80 nm, in accordance with one or more embodiments of the present disclosure. FIG. 12C is a top view of a portion of a pattern mask 120 including groups of three focus-sensitive mask elements 702 distributed with a coarse pitch 1202 of 800 nm, a coarse space 1204 of 380 nm, a focus-sensitive pitch 704 of 160 nm, and a focus-sensitive width 706 of 100 nm, in accordance with one or more embodiments of the present disclosure.

Figure 13A:
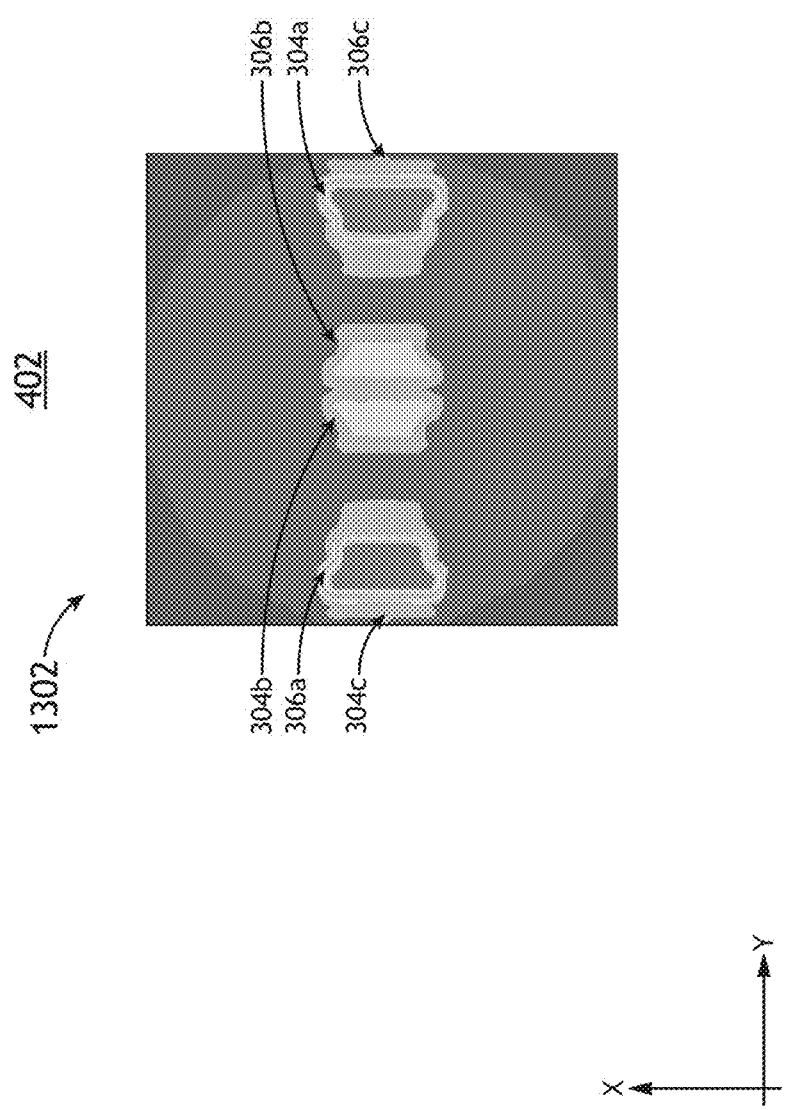
FIG. 13A is a plot of a distribution of illumination in a pupil plane based on the illumination profile of FIG. 3 and the distribution of focus-sensitive mask elements of FIG. 12A, in accordance with one or more embodiments of the present disclosure.
Figure 13B:
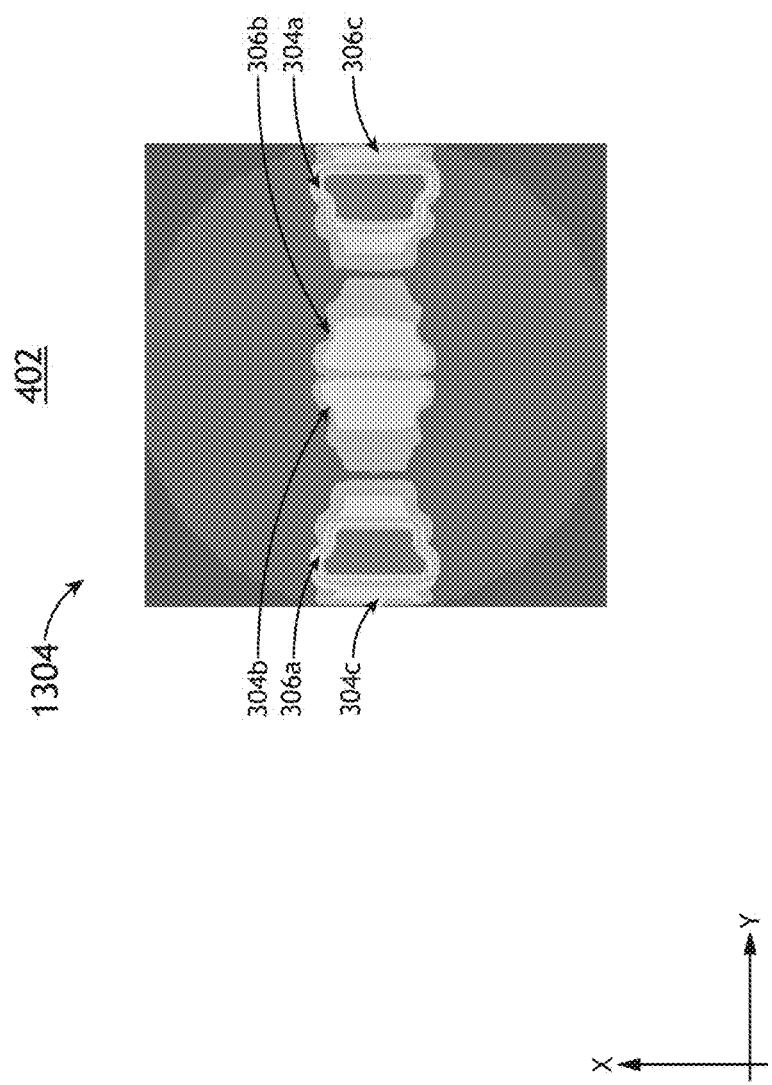
FIG. 13B is a plot of a distribution of illumination in a pupil plane based on the illumination profile of FIG. 3 and the distribution of focus-sensitive mask elements of FIG. 12B, in accordance with one or more embodiments of the present disclosure.
Figure 13C:
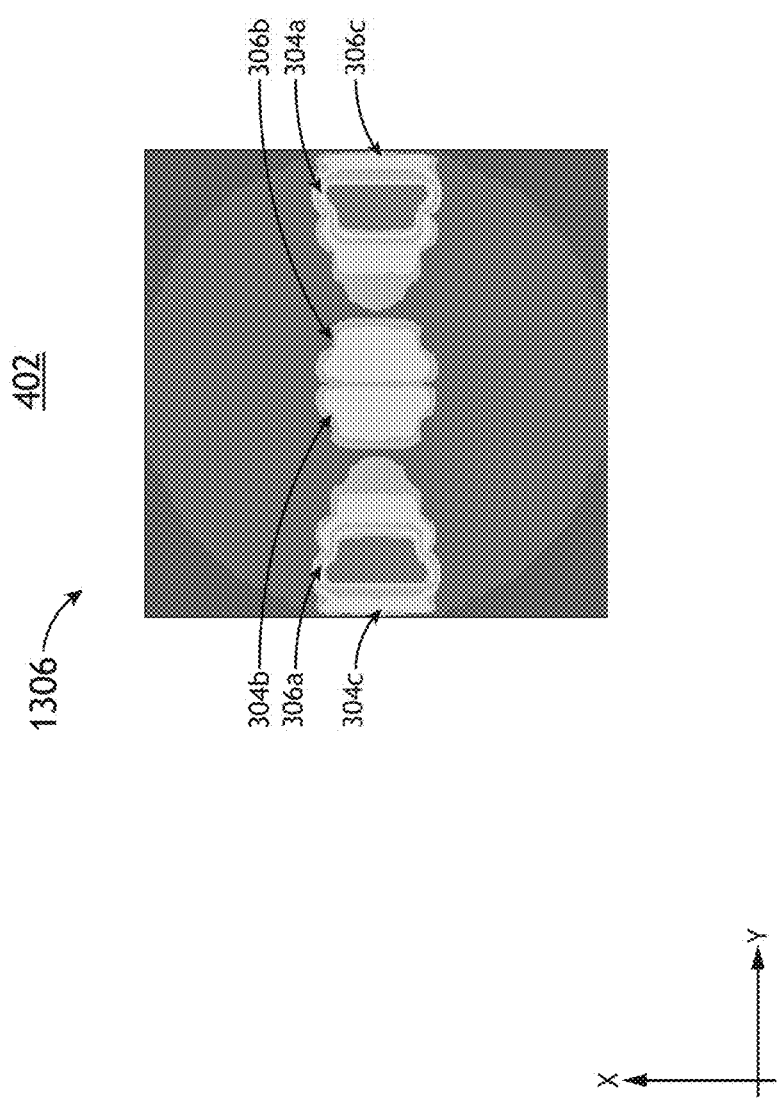
FIG. 13C is a plot of a distribution of illumination in a pupil plane based on the illumination profile of FIG. 3 and the distribution of focus-sensitive mask elements of FIG. 12C, in accordance with one or more embodiments of the present disclosure.

FIG. 13A is a plot 1302 of a distribution of illumination in the pupil plane 402 based on the illumination profile of FIG. 3 and the distribution of focus-sensitive mask elements 702 of FIG. 12A, in accordance with one or more embodiments of the present disclosure. FIG. 13B is a plot 1304 of a distribution of illumination in the pupil plane 402 based on the illumination profile of FIG. 3 and the distribution of focus-sensitive mask elements 702 of FIG. 12B, in accordance with one or more embodiments of the present disclosure. FIG. 13C is a plot 1306 of a distribution of illumination in the pupil plane 402 based on the illumination profile of FIG. 3 and the distribution of focus-sensitive mask elements 702 of FIG. 12C, in accordance with one or more embodiments of the present disclosure.

Figure 14A:
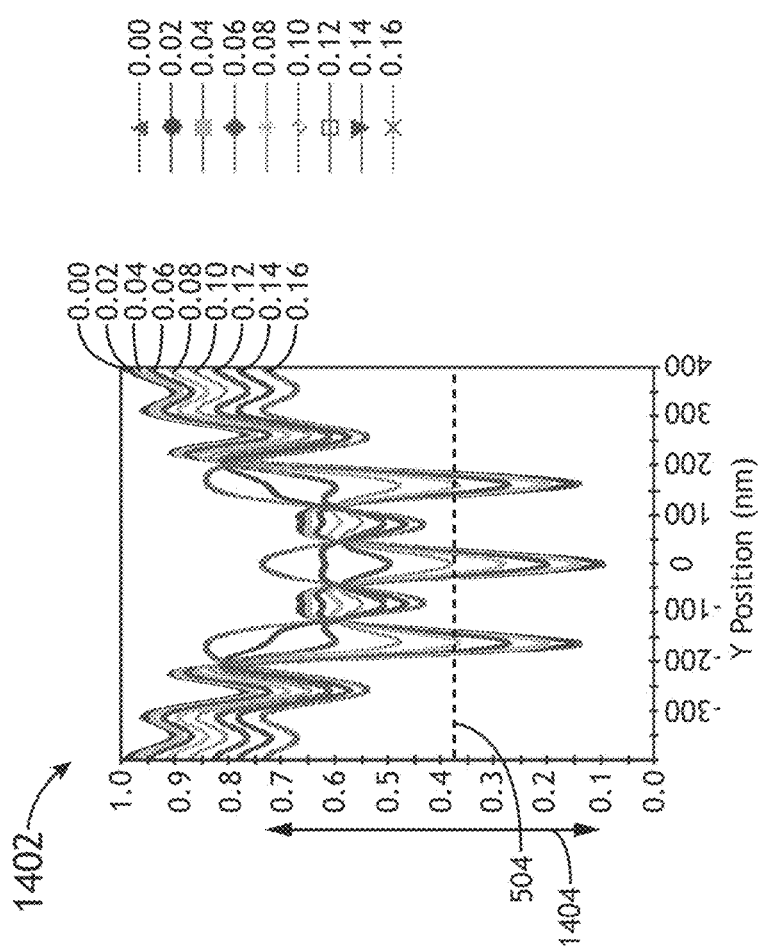
FIG. 14A is a plot of an aerial image associated with the pupil plane distribution of FIG. 13A, in accordance with one or more embodiments of the present disclosure.
Figure 14B:
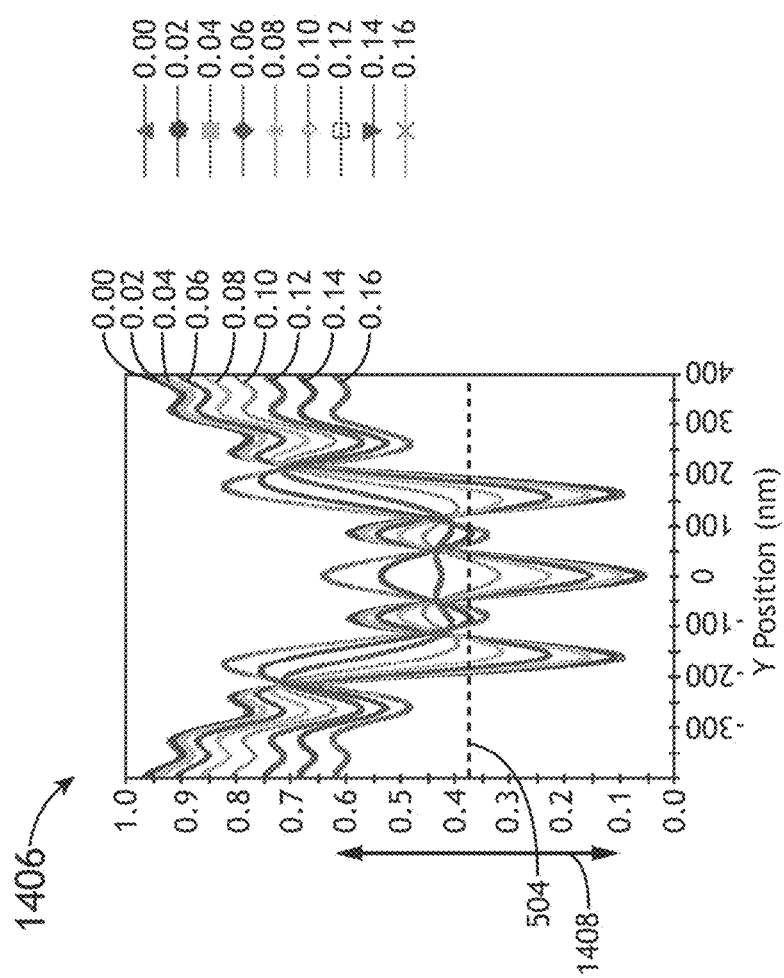
FIG. 14B is a plot of an aerial image associated with the pupil plane distribution of FIG. 13B, in accordance with one or more embodiments of the present disclosure.
Figure 14C:
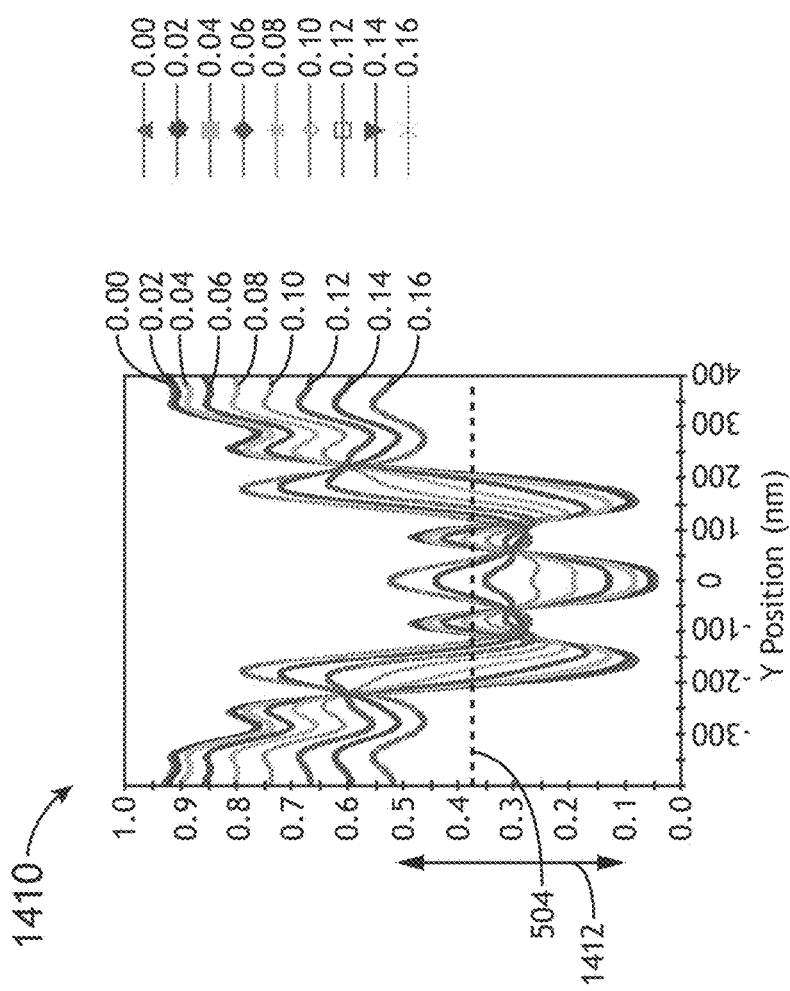
FIG. 14C is a plot of an aerial image associated with the pupil plane distribution of FIG. 13C, in accordance with one or more embodiments of the present disclosure.

FIG. 14A is a plot of an aerial image 1402 associated with the pupil plane 402 distribution of FIG. 13A, in accordance with one or more embodiments of the present disclosure. In one embodiment, varying the focal position of the sample from 0 to 160 nm is associated with a modulation depth 1404 of approximately 0.65. FIG. 14B is a plot of an aerial image 1406 associated with the pupil plane 402 distribution of FIG. 13B, in accordance with one or more embodiments of the present disclosure. In one embodiment, varying the focal position of the sample from 0 to 160 nm is associated with a modulation depth 1408 of approximately 0.6. FIG. 14C is a plot of an aerial image 1410 associated with the pupil plane 402 distribution of FIG. 13C, in accordance with one or more embodiments of the present disclosure. In one embodiment, varying the focal position of the sample from 0 to 160 nm is associated with a modulation depth 1412 of approximately 0.45.

As illustrated in FIGS. 12A through 14C, the value of the focus-sensitive width 706 may be selected to balance the distribution of collected diffraction orders (e.g. the degree of asymmetry) with the relative intensities of collected diffraction orders to provide highly sensitive focus-sensitive mask elements 702. For example, selecting a focus-sensitive width 706 such that the line-space ratio is 1 (e.g. a focus-sensitive width 706 of 80 nm in this example) may provide high suppression of unwanted diffraction orders in the pupil plane 402 (e.g. $2^{nd}$ order diffraction beam 304c and $2^{nd}$ order diffraction beam 306c in this example). This is illustrated by comparing the relative intensities of the $2^{nd}$ order diffraction beam 304c and the $2^{nd}$ order diffraction beam 306c in FIGS. 13A through 13C. However, selecting a focus-sensitive width 706 such that the line-space ratio is 1 may not provide the highest degree of focus-sensitivity. For example, selecting the focus-sensitive width 706 such that the line-space ratio is slightly larger than 1 may equalize the relative intensities of wanted diffraction orders (e.g. 0-order diffraction beam 304a relative to $1^{st}$ order diffraction beam 304b and 0-order diffraction beam 306a relative to $1^{st}$ order diffraction beam 306b as illustrated in FIGS. 13B and 13C) within a specified tolerance and may decrease the modulation depth of the aerial image (e.g. the modulation depth 1412 associated with a line-space ratio of 5/3 is smaller than the modulation depth 1408 associated with a line-space ratio of 1). Alternatively, selecting the focus-sensitive width 706 such that the line-space ratio is slightly smaller than 1 may have an opposite effect of separating the relative intensities of wanted diffraction orders (e.g. 0-order diffraction beam 304a relative to $1^{st}$ order diffraction beam 304b and 0-order diffraction beam 306a relative to $1^{st}$ order diffraction beam 306b as illustrated in FIGS. 13A and 13B) and may increase the modulation depth of the aerial image (e.g. the modulation depth 1404 associated with a line-space ratio of 3/5 is larger than the modulation depth 1408 associated with a line-space ratio of 1).

A comparison of FIGS. 14A through 14C with FIGS. 11A through 11C indicates a high degree of focal sensitivity of focus-sensitive mask elements 702 associated with all three values of focus-sensitive pitch 704. In this regard, the value of the focus-sensitive pitch 704 may be selected to further increase the focal sensitivity and thus further increase the performance of an associated metrology target.

Figure 15B:
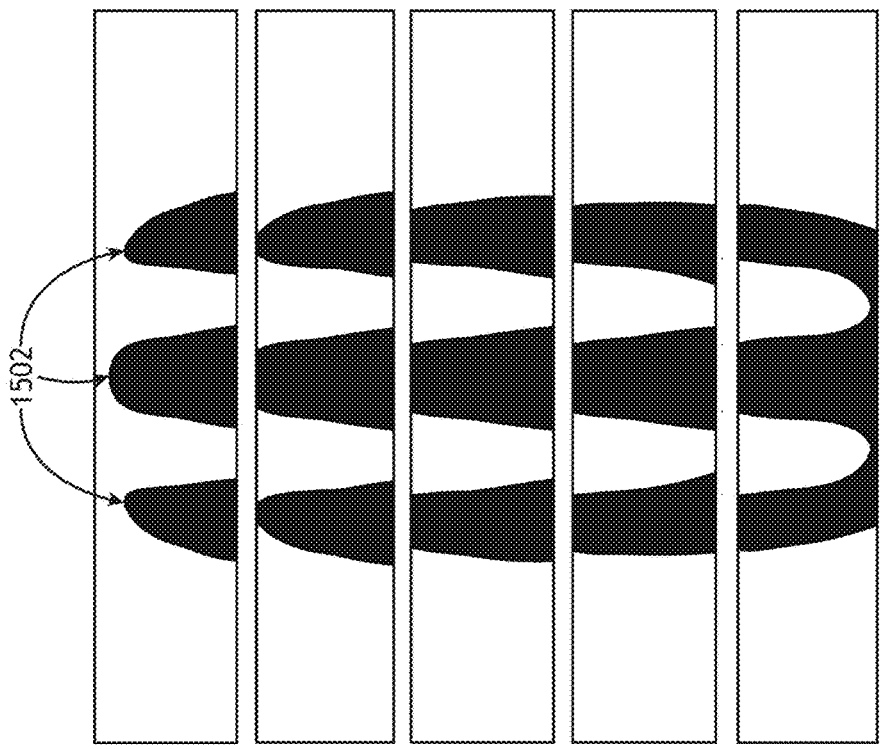
FIG. 15B is a series of simulated profile views of printed focus-sensitive elements on a sample associated with the distribution of focus-sensitive mask elements of FIG. 12C as a function of the focal position of the sample, in accordance with one or more embodiments of the present disclosure.
Figure 15A:
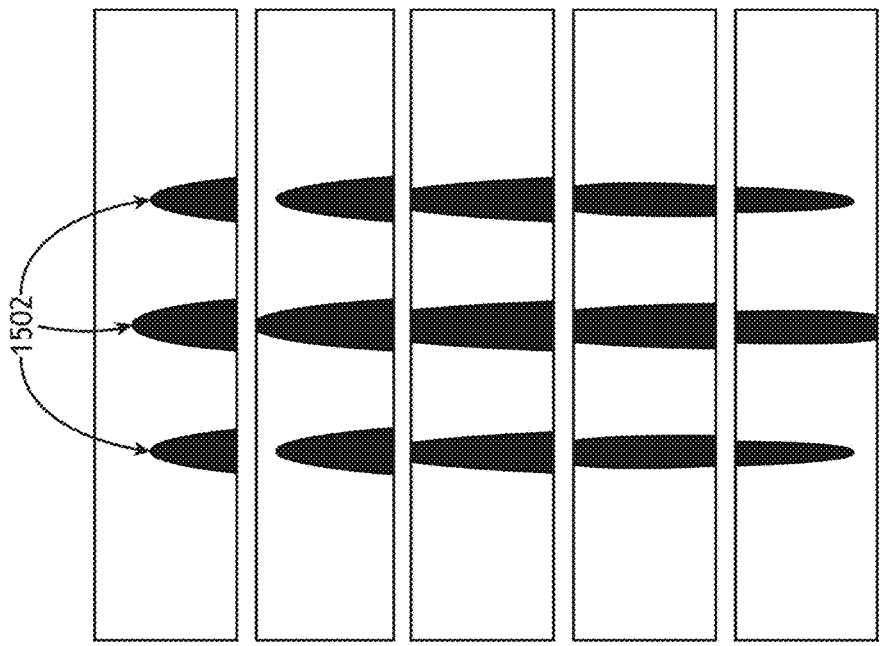
FIG. 15A is a series of simulated profile views of printed focus-sensitive elements on a sample associated with the distribution of focus-sensitive mask elements of FIG. 12A as a function of the focal position of the sample, in accordance with one or more embodiments of the present disclosure.

Further, the selection of the focus-sensitive width 706 may impact the range of focal positions of the sample 124 that may produce printable structures. FIG. 15A is a series of simulated profile views of printed focus-sensitive elements 1502 on a sample 124 associated with the distribution of focus-sensitive mask elements 702 of FIG. 12A as a function of the focal position of the sample 124, in accordance with one or more embodiments of the present disclosure. FIG. 15B is a series of simulated profile views of printed focus-sensitive elements 1502 on a sample 124 associated with the distribution of focus-sensitive mask elements 702 of FIG. 12C as a function of the focal position of the sample 124, in accordance with one or more embodiments of the present disclosure. As illustrated in FIGS. 15A and 15B, selecting a value of the focus-sensitive width 706 such that the line-space ratio is larger than 1 (as opposed to less than 1) may provide not only a high degree of focus-sensitivity, but also robust structure printability of metrology targets. For example, selecting a value of the focus-sensitive width 706 such that the line-space ratio is greater than 1 (e.g., a line-space ratio of 5/3 in FIG. 15B) may provide for robust printed focus-sensitive elements 1502 over a wide range of focal positions of the sample 124. Further, characteristics of the printed focus-sensitive elements 1502 such as, but not limited to, the sidewall angles, structure height, or critical dimensions may vary dramatically based on the sample focal position. In this regard, the resulting printed focus-sensitive elements 1502 may be characterized by a metrology system (e.g., metrology sub-system 104) to determine the focal position of the sample 124 during a lithography process step. Alternatively, selecting a value of the focus-sensitive width 706 such that the line-space ratio is less than 1 (e.g., a line-space ratio of 3/5 in FIG. 15A) may provide for less robust printed focus-sensitive elements 1502 over a wide range of focal positions of the sample 124. For example, in the example illustrated in FIG. 15A, a deviation of the focal position of the sample 124 by 120 nm may result in a printability issue due to insufficient exposure of the sample 124.

It is to be understood that the particular examples of device mask elements 202, a corresponding illumination profile of a lithography illumination source 112, and focus-sensitive mask elements 702 based on the illumination profile are provided solely for illustrative purposes and should not be interpreted as limiting. For example, focus-sensitive mask elements 702 distributed with a coarse pitch 1202 and a focus-sensitive pitch 704 may include any number of focus-sensitive mask elements 702 within an element group. By way of another example, the device mask elements 202 may have any desired size, shape, distribution, or orientation suitable for a semiconductor device. For example, the device mask elements 202 may include a two-dimensional distribution of mask elements. In this regard, the device mask elements 202 may be characterized as being distributed along multiple directions. Further, an associated illumination profile of an illumination source (e.g., lithography illumination source 112) may have any distribution suitable for fabricating any distribution of device mask elements 202. Accordingly, focus-sensitive mask elements 702 may be selected to include focus-sensitive mask elements 702 distributed in any configuration (e.g., a two-dimensional distribution) with multiple values of the focus-sensitive pitch 704 and/or focus-sensitive width 706 oriented in any direction based on an illumination profile to provide printed focus-sensitive elements 1502. For example, an illumination profile may be configured with a first pair of illumination poles distributed along a first direction (e.g., the Y-direction of FIG. 3) and a second pair of illumination poles distributed along a second direction (e.g., the X-direction of FIG. 3). Accordingly, focus-sensitive mask elements 702 may be designed to be distributed with a first focus-sensitive pitch 704 and focus-sensitive width 706 along the first direction and a second focus-sensitive pitch 704 and focus-sensitive width 706 along the second direction to provide printed focus-sensitive elements 1502 having focus-sensitive characteristics measurable (e.g., by a metrology sub-system 104) along the first and/or the second direction.

Referring again to FIGS. 1A through 1D, an illumination source (e.g. the lithography illumination source 112, the metrology illumination source 130, or the like) may include any illumination source known in the art suitable for generating an illumination beam (e.g. illumination beam 114, metrology illumination beam 132, or the like). For example, the illumination source may include, but is not limited to, a monochromatic light source (e.g. a laser), a polychromatic light source with a spectrum including two or more discrete wavelengths, a broadband light source, or a wavelength-sweeping light source. Further, the illumination source may be, but is not required to be, formed from a white light source (e.g. a broadband light source with a spectrum including visible wavelengths), a laser source, a free-form illumination source, a single-pole illumination source, a multi-pole illumination source, an arc lamp, an electrodeless lamp, or a laser sustained plasma (LSP) source.

In another embodiment, the wavelengths of radiation of the one or more illumination beams emitted by the illumination source are tunable. In this regard, the wavelengths of radiation of the one or more illumination beams may be adjusted to any selected wavelength of radiation (e.g. UV radiation, visible radiation, infrared radiation, or the like).

The illumination source may also be configured to provide light having high brightness. For example, the illumination source may provide an illumination beam having a brightness greater than about 1 W/(nm cm$^2$ Sr). The system 100 may also include a fast feedback to the light source for stabilizing its power and wavelength. Output of the light source can be delivered via free-space propagation, or in some cases delivered via optical fiber or light guide of any type. Further, an illumination beam may be delivered via free-space propagation or guided light (e.g. an optical fiber, a light pipe, or the like).

It is noted herein that the pattern mask 120 may be a reflective or a transmissive element. In one embodiment, the pattern mask 120 is a transmissive element in which pattern elements fully or partially block the transmission of an illumination beam 114 (e.g. through absorption or reflection of the illumination beam 104). Accordingly, the illumination beam 114 may be transmitted through spaces between pattern elements to the set of projection optics 122. For example, a pattern mask 120 in which pattern elements fully block the transmission of the illumination beam 114 may operate as a binary pattern mask. It is further recognized that focus-sensitive binary pattern masks in which light from a lithography illumination source 112 is either fully blocked or fully transmitted/reflected to generate an image may be utilized to determine a focal position of a sample in a lithography sub-system 102. For example, binary pattern masks may be relatively inexpensive to fabricate and may be readily incorporated into many lithography systems. In another embodiment, features of the pattern mask 120 (e.g. pattern elements, spaces between pattern elements, or the like) are designed to modify the optical phase of an illumination beam 114. In this regard, the pattern mask 120 may operate as a phase mask (e.g. an alternating phase shift mask, or the like).

In another embodiment, the pattern mask 120 is a reflective mask in which pattern mask elements fully or partially reflect an illumination beam 114 to the set of projection optics 122 and the spaces between pattern mask elements absorb or transmit the illumination beam 114. Further, pattern elements of the pattern mask 120 may be formed from any opaque or semi-opaque material known in the art for reflecting and/or absorbing an illumination beam 114. In another embodiment, the pattern mask elements may include a metal. For example, the pattern mask elements may be, but are not required to be, formed from chrome (e.g. a chrome alloy, or the like).

In this regard, the mask support device 118 may hold the pattern mask 120 utilizing any means known in the art, such as, but not limited to, a mechanical, vacuum, electrostatic or other clamping technique.

In another embodiment, the system 100 includes a sample stage 126 suitable for securing a sample 124. The sample stage 126 may include any sample stage architecture known in the art. For example, the sample stage 126 may include, but is not limited to, a linear stage. By way of another example, the stage assembly 118 may include, but is not limited to, a rotational stage. Further, the sample 106 may include a wafer, such as, but not limited to, a semiconductor wafer.

Referring to FIGS. 1C and 1D, embodiments of the present disclosure may incorporate any type of metrology system known in the art including, but not limited to, a spectroscopic ellipsometer with one or more angles of illumination, a spectroscopic ellipsometer for measuring Mueller matrix elements (e.g. using rotating compensators), a single-wavelength ellipsometer, an angle-resolved ellipsometer (e.g. a beam-profile ellipsometer), a spectroscopic reflectometer, a single-wavelength reflectometer, an angle-resolved reflectometer (e.g. a beam-profile reflectometer), an imaging system, a pupil imaging system, a spectral imaging system, or a scatterometer. Further, the metrology system may include a single metrology tool or multiple metrology tools. A metrology system incorporating multiple metrology tools is generally described in U.S. Pat. No. 7,933,026, issued on Apr. 26, 2011, and U.S. Pat. No. 7,478,019, issued on Jan. 13, 2009, both of which are incorporated herein by reference in their entirety. Focused beam ellipsometry based on primarily reflective optics is generally described in U.S. Pat. No. 5,608,526, which is incorporated herein by reference in its entirety. The use of apodizers to mitigate the effects of optical diffraction causing the spread of the illumination spot beyond the size defined by geometric optics is generally described in U.S. Pat. No. 5,859,424, which is incorporated herein by reference in its entirety. The use of high-numerical-aperture tools with simultaneous multiple angle-of-incidence illumination is generally described by U.S. Pat. No. 6,429,943, which is incorporated herein by reference in its entirety. Quantifying imaging performance in high NA optical lithography is generally described in Lee, et al., "Quantifying imaging performance bounds of extreme dipole illumination in high NA optical lithography", Proc. of SPIE Vol. 9985 99850X-1 (2016), which is incorporated herein by reference in its entirety.

It is further recognized herein that a metrology tool may measure characteristics of one or more targets such as, but not limited to, critical dimensions (CD), overlay, sidewall angles, film thicknesses, or process-related parameters (e.g., focus, dose, and the like). The targets may include certain regions of interest that are periodic in nature, such as for example gratings in a memory die. The metrology targets may further possess various spatial characteristics and are typically constructed of one or more cells which may include features in one or more layers which may have been printed in one or more lithographically distinct exposures. The targets or the cells may possess various symmetries such as two-fold or four-fold rotation symmetry or reflection symmetry. Examples of such metrology structures are described in U.S. Pat. No. 6,985,618, which is included herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures. The periodic structures may be non-segmented or they may be constructed from finely segmented features which may be at or close to the minimum design rule of the lithographic process used to print them.

Metrology targets may be collocated or in close proximity with dummification structures in the same layer or in a layer above, below or in between the layers of the metrology structures. Targets can include multiple layers (e.g. films) whose thicknesses can be measured by the metrology tool. Further, a metrology tool may, but is not required to, measure the composition of one or more layers of a semiconductor stack or one or more defects on or within a sample. The use of a metrology tool to characterize non-periodic targets is generally described in U.S. Pat. No. 9,291,554, granted on Mar. 22, 2016, which is incorporated herein by reference in its entirety.

Targets can include target designs placed on the semiconductor wafer for use (e.g., with alignment, overlay registration operations, and the like). Further, targets may be located at multiple sites on the semiconductor wafer. For example, targets may be located within scribe lines (e.g., between dies) and/or located in the die itself. Multiple targets may be measured simultaneously or serially by the same or multiple metrology tools as described in U.S. Pat. No. 7,478,019, which is incorporated herein by reference in its entirety.

Additionally, measurement of parameters of interest may involve a number of algorithms. For example, optical interaction of the metrology illumination beam 132 with a metrology target on the sample 124 may be, but is not limited to be, modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis. A geometric engine is implemented, for example, in AcuShape software provided by KLA-TENCOR. Additionally, collected data may be analyzed using data fitting and optimization techniques including, but not limited to, libraries, fast-reduced-order models, regression, machine-learning algorithms such as neural networks, support-vector machines (SVM), dimensionality-reduction algorithms (e.g., principal component analysis (PCA), independent component analysis (ICA), local-linear embedding (LLE), and the like), and sparse representation of data (e.g., Fourier or wavelet transforms, Kalman filters, algorithms to promote matching from same or different tool types, and the like). For example, data collection and/or fitting may be, but is not required to be, performed by the Signal Response Metrology (SRM) software product provided by KLA-TENCOR.

In another embodiment, raw data generated by a metrology tool is analyzed by algorithms that do not include modeling, optimization and/or fitting (e.g. phase characterization, or the like). The use of symmetric target design in scatterometry overlay metrology is generally described in U.S. Patent Publication No. 2015/0204664, published on Jul. 23, 2015, which is incorporated herein by reference in its entirety. It is noted herein that computational algorithms performed by the controller may be, but are not required to be, tailored for metrology applications through the use of parallelization, distributed computation, load-balancing, multi-service support, design and implementation of computational hardware, or dynamic load optimization. Further, various implementations of algorithms may be, but are not required to be, performed by the controller (e.g. though firmware, software, or field-programmable gate arrays (FPGAs), and the like), or one or more programmable optical elements associated with the metrology tool. The use of process modeling is generally described in U.S. Patent Publication No. 2014/0172394, published on Jun. 19, 2014, which is incorporated herein by reference in its entirety.

In another embodiment, the angle of incidence of the metrology illumination beam 132 on the sample 124 is adjustable. For example, the path of the metrology illumination beam 132 through the beamsplitter 148 and the objective lens 140 may be adjusted to control the angle of incidence of the metrology illumination beam 132 on the sample 124. In this regard, the metrology illumination beam 132 may have a nominal path through the beamsplitter 148 and the objective lens 140 such that the metrology illumination beam 132 has a normal incidence angle on the sample 124. Further, the angle of incidence of the metrology illumination beam 132 on the sample 124 may be controlled by modifying the position and/or angle of the metrology illumination beam 132 on the beamsplitter 148 (e.g., by rotatable mirrors, a spatial light modulator, a free-form illumination source, or the like). In another embodiment, the metrology illumination source 130 directs the one or more metrology illumination beams 132 to the sample 124 at an angle (e.g., a glancing angle, a 45-degree angle, or the like).

In another embodiment, the controller 106 is communicatively coupled to the metrology illumination source 130 to direct the adjustment of the angle of incidence between the metrology illumination beam 132 and the sample 124. In another embodiment, the controller 106 directs the metrology illumination source 130 to provide one or more selected wavelengths of illumination (e.g., in response to feedback). In a general sense, the controller 106 may be communicatively coupled with any element within the metrology subsystem 104.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 110. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into system 100. Further, the controller 106 may analyze data received from the detector 142 and feed the data to additional components within the metrology sub-system 104 or external to the system 100.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random access memory, a magnetic or optical memory device (e.g., disk), a magnetic tape, a solid state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

Figure 16:
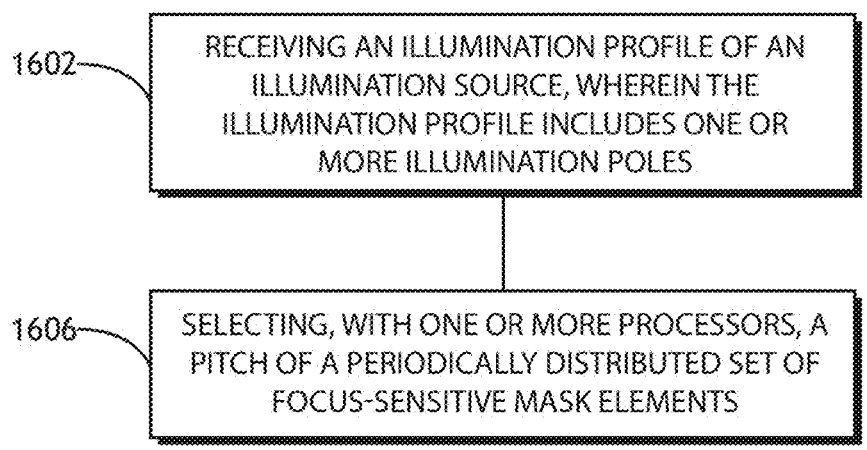
FIG. 16 is a flow diagram illustrating steps performed in a method for defining a focus-sensitive pattern mask, in accordance with one or more embodiments of the present disclosure.

FIG. 16 is a flow diagram illustrating steps performed in a method 1600 for defining a focus-sensitive pattern mask, in accordance with one or more embodiments of the present disclosure. Applicant notes that the embodiments and enabling technologies described previously herein in the context of system 100 should be interpreted to extend to method 1600. It is further noted, however, that the method 1600 is not limited to the architecture of system 100.

In one embodiment, the method 1600 includes a step 1602 of receiving an illumination profile of an illumination source. The illumination profile may be any illumination profile known in the art. In one embodiment, the illumination includes one or more illumination poles. For example, the illumination profile is configured, in conjunction with a lithography system, to provide focus-insensitive printed device elements. In this regard, the one or more illumination poles of the illumination profile may be distributed along a first direction and configured to provide symmetric illumination of pattern mask elements along the first direction.

In another embodiment, the method 1600 includes a step 1604 of selecting, with one or more processors, a pitch of a periodically-distributed set of focus-sensitive mask elements. For example, the set of focus-sensitive mask elements may be configured to diffract illumination from the one or more illumination poles. By way of another example, the pitch may be configured such that two diffraction orders of illumination associated with each of the one or more illumination poles may be asymmetrically distributed in a pupil plane of one or more projection optics (e.g. associated with a lithography system). In this regard, the pitch of the focus-sensitive mask elements may be selected by the one or more processors based on the constraints of the received illumination profile and a known configuration of the one or more projection optics to diffract illumination from each of the illumination poles in an asymmetric configuration in the pupil plane.

By way of another example, the one or more projection optics may expose a sample with an image of the set of focus-sensitive mask elements based on the two diffraction orders of illumination associated with each of the one or more illumination poles. In this regard, the pitch of the focus-sensitive mask elements may be selected (e.g., by one or more processors) to control the diffraction orders of illumination to be collected by the projection optics and this control the distribution of illumination in the pupil plane.

Further, the pitch of the focus-sensitive mask elements may be selected such that one or more printing characteristics of the sample (e.g. sidewall angles, critical dimensions, pattern placement, or the like) may be indicative of the position of the sample within the focal volume of the one or more projection optical elements. Accordingly, printed elements fabricated on the sample based on the image of the focus-sensitive mask elements may exhibit focus-sensitive printing characteristics.

In one embodiment, focus-sensitive printing characteristics of the sample are measurable by a metrology system. Accordingly, the focal position of the sample may be determined based on metrology data of printed device features associated with the image of the focus-sensitive mask elements. Further, the metrology data including the focal position of the sample may be provided as control data (e.g. either as feedback data to a lithography tool, or as feed-forward data to one or more additional process tools).

In another embodiment, the widths of focus-sensitive mask elements may be selected (e.g. by one or more processors) to equalize the relative intensities of the two diffraction orders of illumination associated with each of the one or more illumination poles within a specified tolerance. In this regard, the widths of focus-sensitive mask elements may be selected to allow a portion of an additional diffraction order (e.g. an unwanted diffraction order) to be collected by the one or more projection optics. Accordingly, the asymmetry of the distribution of illumination in the pupil plane associated with each illumination pole may be decreased relative to a selected pitch in which all unwanted diffraction orders are suppressed. However, any negative impacts on the focus-sensitivity of the focus-sensitive mask elements (and thus the focus-sensitivity of printed elements based on an image of the focus-sensitive mask elements) may be compensated by the at least partial equalization of the relative intensities of the two diffraction orders of illumination associated with each of the illumination poles, which may increase the impact of the asymmetric distribution. As a result, the widths of focal-sensitive mask elements along the direction of the pitch may be selected to optimize focus-sensitivity within the constraints of the received illumination profile and the configuration of the one or more projection optics.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A lithography system comprising:
  an illumination source, wherein the illumination source includes one or more illumination poles;
  one or more projection optical elements; and
  a pattern mask, wherein the pattern mask includes a set of focus-sensitive mask elements periodically distributed with a pitch, wherein the set of focus-sensitive mask elements is configured to diffract illumination from the one or more illumination poles, wherein the pitch is selected such that two diffraction orders of illumination associated with each of the one or more illumination poles are asymmetrically distributed in a pupil plane of the one or more projection optical elements, wherein widths of focus-sensitive mask elements in the set of focus-sensitive mask elements along a direction of the pitch are selected to equalize intensities of the two diffraction orders of illumination associated with at least one of the one or more illumination poles in the pupil plane within a specified tolerance, wherein the one or more projection optical elements are configured to expose a sample with an image of the set of focus-sensitive pattern mask elements based on the two diffraction orders of illumination associated with each of the one or more illumination poles, wherein one or more printing characteristics of the image of the set of focus-sensitive pattern mask elements on the sample is indicative of a position of the sample within a focal volume of the one or more projection optical elements.

2. The lithography system of claim 1, wherein the specified tolerance is within a range of approximately 1% to approximately 30%.

3. The lithography system of claim 1, wherein the widths of focus-sensitive mask elements of the set of focus-sensitive mask elements along the direction of the pitch are selected to be larger than half of the pitch.

4. The lithography system of claim 1, wherein the set of focus-sensitive mask elements comprises:
  two or more element groups including two or more focus-sensitive mask elements distributed with the pitch.

5. The lithography system of claim 4, wherein a separation between adjacent element groups of the two or more element groups is larger than twice the pitch.

6. The lithography system of claim 1, wherein the one or more illumination poles include at least one off-axis illumination pole.

7. The lithography system of claim 1, wherein the set of focus-sensitive mask elements diffracts illumination from an illumination pole of the one or more illumination poles into at least a first diffraction order and a second diffraction order, wherein the pitch is selected such that the first diffraction order of illumination is proximate to a center of the pupil plane and the second diffraction order is proximate to an edge of the pupil plane.

8. The lithography system of claim 7, wherein the first diffraction order comprises:
  at least one of a 0 diffraction order, a ±1 diffraction order, or a ±2 diffraction order.

9. The lithography system of claim 7, wherein the second diffraction order comprises:
  at least one of a 0 diffraction order, a ±1 diffraction order, or a ±2 diffraction order.

10. The lithography system of claim 1, wherein the one or more printing characteristics comprise:
  at least one of a placement position, a critical dimension, a sidewall angle, or a structure height.

11. The lithography system of claim 1, wherein the pattern mask is at least one of a bright-field pattern mask or a dark-field pattern mask.

12. The lithography system of claim 1, wherein the set of focus-sensitive mask elements comprises:
  a substantially opaque material.

13. The lithography system of claim 12, wherein the substantially opaque material includes a metal.

14. The lithography system of claim 1, wherein the illumination source comprises:

at least one of a single-pole illumination source, a dipole illumination source, a C-Quad illumination source, a Quasar illumination source, or a free-form illumination source.

15. The lithography system of claim 1, wherein the one or more illumination poles comprise:
two off-axis illumination poles separated along an offset direction, wherein the set of focus-sensitive mask elements is periodically distributed with the pitch along the offset direction.

16. The lithography system of claim 15, wherein a combined distribution of illumination in the pupil plane associated with the two off-axis illumination poles is symmetric around a symmetry axis perpendicular to the offset direction.

17. A focus-sensitive pattern mask for a lithography system comprising:
a set of focus-sensitive mask elements periodically distributed with a pitch, wherein the set of focus-sensitive mask elements is configured to diffract illumination from the one or more illumination poles, wherein the pitch is configured such that two diffraction orders of illumination associated with each of the one or more illumination poles are asymmetrically distributed in a pupil plane of one or more projection optical elements, wherein widths of focus-sensitive mask elements in the set of focus-sensitive mask elements along a direction of the pitch are selected to equalize intensities of the two diffraction orders of illumination associated with at least one of the one or more illumination poles in the pupil plane within a specified tolerance, wherein the one or more projection optical elements are configured to expose a sample with an image of the set of focus-sensitive pattern mask elements based on the two diffraction orders of illumination associated with each of the one or more illumination poles, wherein one or more printing characteristics of the image of the set of focus-sensitive pattern mask elements on the sample is indicative of a position of the sample within a focal volume of the one or more projection optical elements.

18. The focus-sensitive pattern mask of claim 17, wherein the specified tolerance is within a range of 1% to 30%.

19. The focus-sensitive pattern mask of claim 17, wherein the widths of focus-sensitive mask elements of the set of focus-sensitive mask elements along the direction of the pitch are selected to be larger than half of the pitch.

20. The focus-sensitive pattern mask of claim 17, wherein the set of focus-sensitive mask elements comprises:
two or more element groups including two or more focus-sensitive mask elements distributed with the pitch.

21. The focus-sensitive pattern mask of claim 20, wherein a separation between adjacent element groups of the two or more element groups is selected to be larger than twice the pitch.

22. The focus-sensitive pattern mask of claim 20, wherein the one or more illumination poles include at least one off-axis illumination pole.

23. The focus-sensitive pattern mask of claim 17, wherein the set of focus-sensitive mask elements is configured to diffract illumination from an illumination pole of the one or more illumination poles into at least a first diffraction order and a second diffraction order, wherein the pitch is selected such that the first diffraction order of illumination is proximate to a center of the pupil plane and the second diffraction order is proximate to an edge of the pupil plane.

24. The focus-sensitive pattern mask of claim 23, wherein the first diffraction order comprises:
at least one of a 0 diffraction order, a ±1 diffraction order, or a ±2 diffraction order.

25. The focus-sensitive pattern mask of claim 23, wherein the second diffraction order comprises:
at least one of a 0 diffraction order, a ±1 diffraction order, or a ±2 diffraction order.

26. The focus-sensitive pattern mask of claim 17, wherein the one or more printing characteristics comprise:
at least one of a placement position, a critical dimension, a sidewall angle, or a structure height.

27. The focus-sensitive pattern mask of claim 17, wherein the set of focus-sensitive mask elements comprises:
a substantially opaque material.

28. The focus-sensitive pattern mask of claim 27, wherein the substantially opaque material includes a metal.

29. A method for defining a focus-sensitive pattern mask comprising:
receiving an illumination profile of an illumination source, wherein the illumination profile includes one or more illumination poles;
selecting, with one or more processors, a pitch of a periodically distributed set of focus-sensitive mask elements, wherein the set of focus-sensitive mask elements is configured to diffract illumination from the one or more illumination poles, wherein the pitch is selected such that two diffraction orders of illumination associated with each of the one or more illumination poles are asymmetrically distributed in a pupil plane of one or more projection optical elements; and
selecting, with one or more processors, widths of focus-sensitive mask elements in the set of focus-sensitive mask elements along a direction of the pitch to equalize intensities of the two diffraction orders of illumination associated with at least one of the one or more illumination poles in the pupil plane within a specified tolerance, wherein the one or more projection optical elements expose a sample with an image of the set of focus-sensitive pattern mask elements based on the two diffraction orders of illumination associated with each of the one or more illumination poles, wherein one or more printing characteristics of the image of the set of focus-sensitive pattern mask elements on the sample is indicative of a position of the sample within a focal volume of the one or more projection optical elements.

30. The method for defining a focus-sensitive pattern mask of claim 29, wherein the specified tolerance is within a range of 1% to 30%.

31. The method for defining a focus-sensitive pattern mask of claim 29, wherein the widths of focus-sensitive mask elements of the set of focus-sensitive mask elements along the direction of the pitch are selected to be larger than half of the pitch.

32. The method for defining a focus-sensitive pattern mask of claim 29, wherein the set of focus-sensitive mask elements comprises two or more element groups including two or more focus-sensitive mask elements distributed with the pitch, wherein the method for defining a focus-sensitive pattern mask further comprises:
selecting, with one or more processors, a separation between adjacent element groups of the two or more element groups to be larger than twice the pitch.

33. The method for defining a focus-sensitive pattern mask of claim 29, wherein the one or more illumination poles include at least one off-axis illumination pole.

34. The method for defining a focus-sensitive pattern mask of claim 29, wherein the set of focus-sensitive mask elements is configured to diffract illumination from an illumination pole of the one or more illumination poles into at least a first diffraction order and a second diffraction order, wherein selecting a pitch of a periodically distributed set of focus-sensitive mask elements comprises:

selecting the pitch such that the first diffraction order of illumination is proximate to a center of the pupil plane and the second diffraction order is proximate to an edge of the pupil plane.

35. The method for defining a focus-sensitive pattern mask of claim 29, wherein the illumination profile includes two off-axis illumination poles separated along an offset direction, wherein the set of focus-sensitive mask elements is selected to be periodically distributed with the pitch along the offset direction, wherein the pitch is further selected such that a combined distribution of illumination in the pupil plane associated with the two off-axis illumination poles is symmetric around a symmetry axis perpendicular to the offset direction.

* * * * *